(12) United States Patent
Takamori et al.

(10) Patent No.: US 6,567,685 B2
(45) Date of Patent: May 20, 2003

(54) MAGNETIC RESONANCE IMAGING APPARATUS

(75) Inventors: Hiromitsu Takamori, Otawara (JP); Ayumi Katsunuma, Otawara (JP); Hitoshi Kanazawa, Utsunomiya (JP); Takeshiro Suzuki, Otawara (JP); Seiji Nozaki, Otawara (JP); Masatoshi Hanawa, Otawara (JP); Yoshio Machida, Nasu-gun (JP); Masaaki Yamanaka, Otawara (JP); Masao Yui, Otawara (JP)

(73) Assignee: Kabushiki Kaisha Toshiba, Kawaski (JP)

( * ) Notice: Subject to any disclaimer, the term of this patent is extended or adjusted under 35 U.S.C. 154(b) by 182 days.

(21) Appl. No.: 09/764,215

(22) Filed: Jan. 19, 2001

(65) Prior Publication Data

US 2001/0010464 A1 Aug. 2, 2001

(30) Foreign Application Priority Data

| | | | |
|---|---|---|---|
| Jan. 21, 2000 | (JP) | ...................................... | 2000-013236 |
| Jan. 25, 2000 | (JP) | ...................................... | 2000-015419 |
| Apr. 28, 2000 | (JP) | ...................................... | 2000-131610 |
| Dec. 28, 2000 | (JP) | ...................................... | 2000-400361 |

(51) Int. Cl.[7] .............................................. A61B 5/05
(52) U.S. Cl. ...................................................... 600/410
(58) Field of Search ................................. 600/407, 410, 600/411, 412, 423; 324/307; 436/173

(56) References Cited

U.S. PATENT DOCUMENTS

| | | | |
|---|---|---|---|
| 4,652,824 A | | 3/1987 | Oppelt |
| 5,053,711 A | | 10/1991 | Hayes et al. |
| 5,361,763 A | * | 11/1994 | Kao et al. .................. 382/145 |
| 5,404,882 A | * | 4/1995 | Santyr ........................ 324/309 |
| 5,489,848 A | * | 2/1996 | Furukawa .................... 324/318 |
| 5,764,059 A | * | 6/1998 | Mansfield et al. .......... 324/318 |
| 5,793,210 A | * | 8/1998 | Pla et al. ..................... 324/318 |
| 6,022,195 A | * | 2/2000 | Gaudet et al. ................. 417/27 |
| 6,043,653 A | * | 3/2000 | Takamori et al. ........... 324/300 |
| 6,157,276 A | * | 12/2000 | Hedeen et al. .............. 324/318 |
| 6,353,319 B1 | * | 3/2002 | Dietz et al. .................. 324/318 |
| 6,406,427 B1 | * | 6/2002 | Williams et al. ............ 600/301 |
| 6,437,568 B1 | * | 8/2002 | Edelstein et al. ........... 324/309 |
| 6,441,614 B1 | * | 8/2002 | Edelstein et al. ........... 324/307 |

FOREIGN PATENT DOCUMENTS

| | | |
|---|---|---|
| JP | 59-174746 | 10/1984 |
| JP | 63-246146 | 10/1988 |
| JP | 6-189932 | 7/1994 |
| JP | 2642348 | 5/1997 |
| JP | 10-118043 | 5/1998 |
| JP | 10-179547 | 7/1998 |
| SU | 968738 | * 10/1982 |

OTHER PUBLICATIONS

Katsunuma et al, "Silent MRI System by Interrupting the Vibrational Transmission Through the Air and Solid Structures", ISMRM, 1372, 2000.

* cited by examiner

*Primary Examiner*—Teresa Walberg
*Assistant Examiner*—Daniel Robinson
(74) *Attorney, Agent, or Firm*—Nixon & Vanderhye, P.C.

(57) ABSTRACT

A magnetic resonance imaging apparatus generates an MR signal from an object by applying a gradient field pulse generated by a gradient field coil and a high-frequency magnetic field pulse generated by a high-frequency coil to the object in a static field, and reconstructs an image on the basis of the MR signal. The gradient field coil is housed in a sealed vessel. The internal air in the sealed vessel is exhausted by the pump to prevent noise. By controlling the operation of the pump using a control circuit, noise in imaging operation can be reduced more effectively.

16 Claims, 20 Drawing Sheets

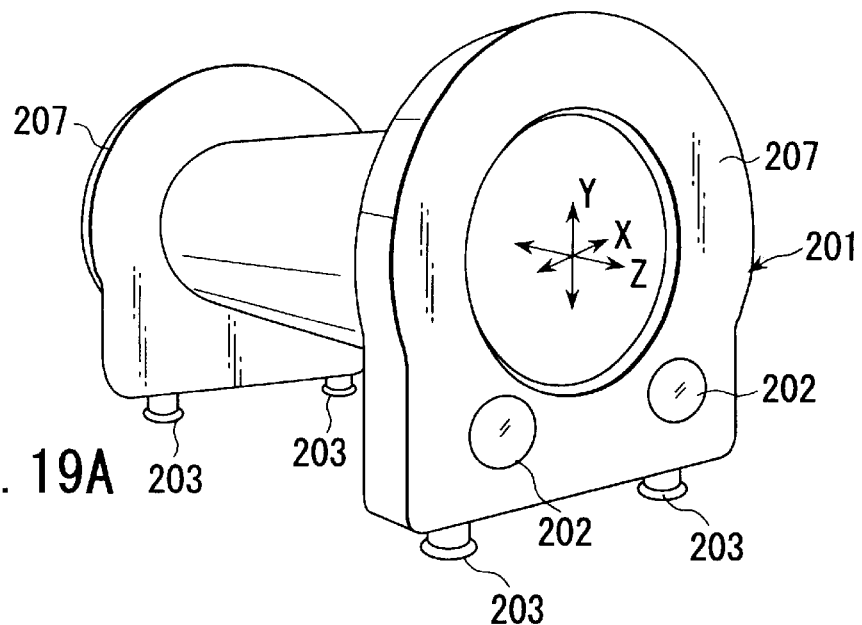
FIG. 19A
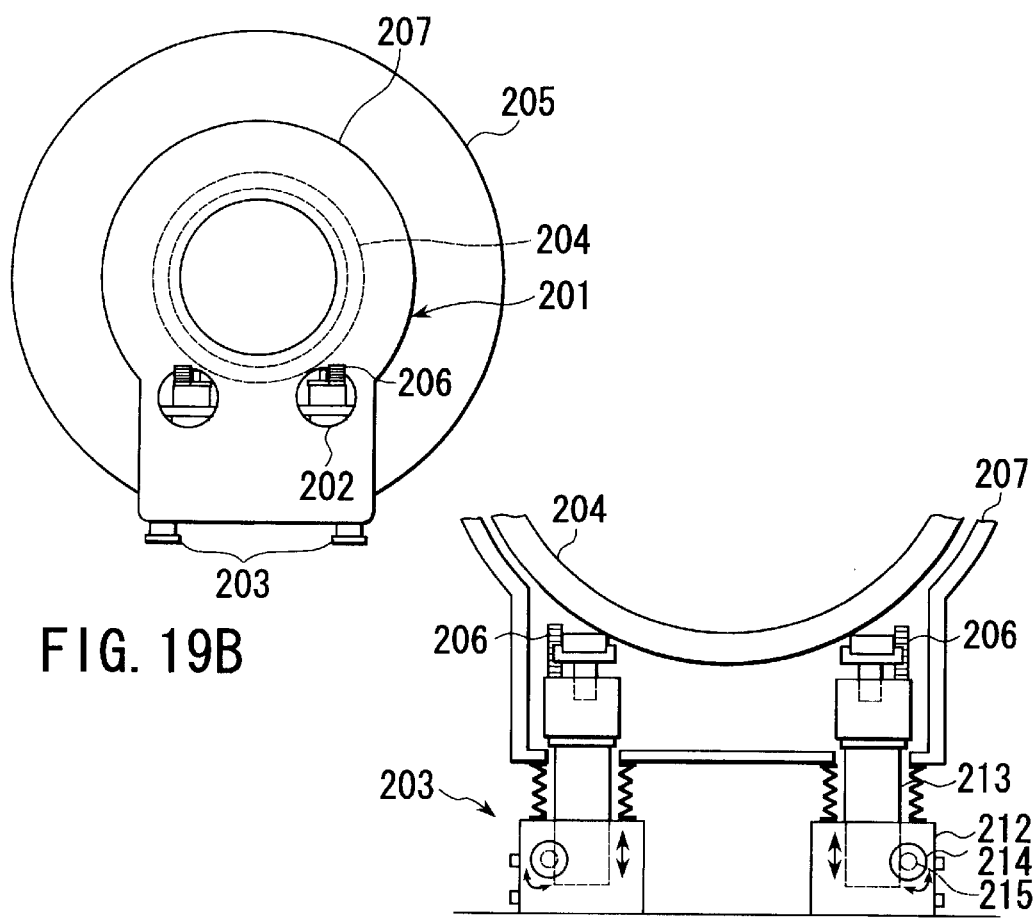
FIG. 19B
FIG. 19C

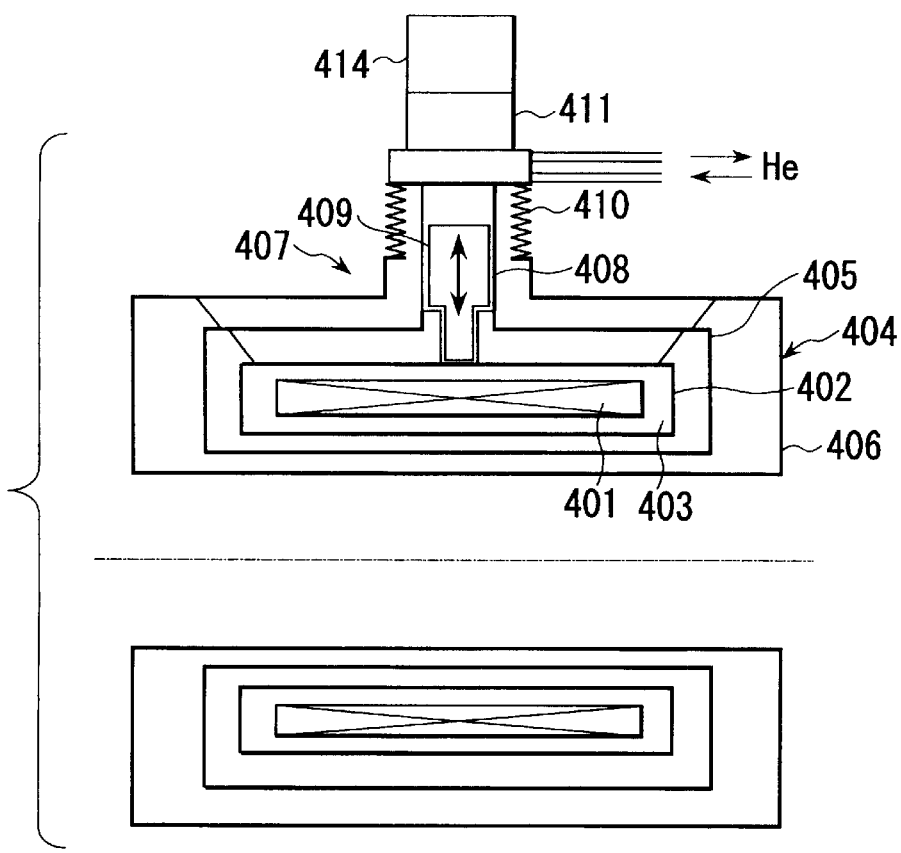
FIG. 22
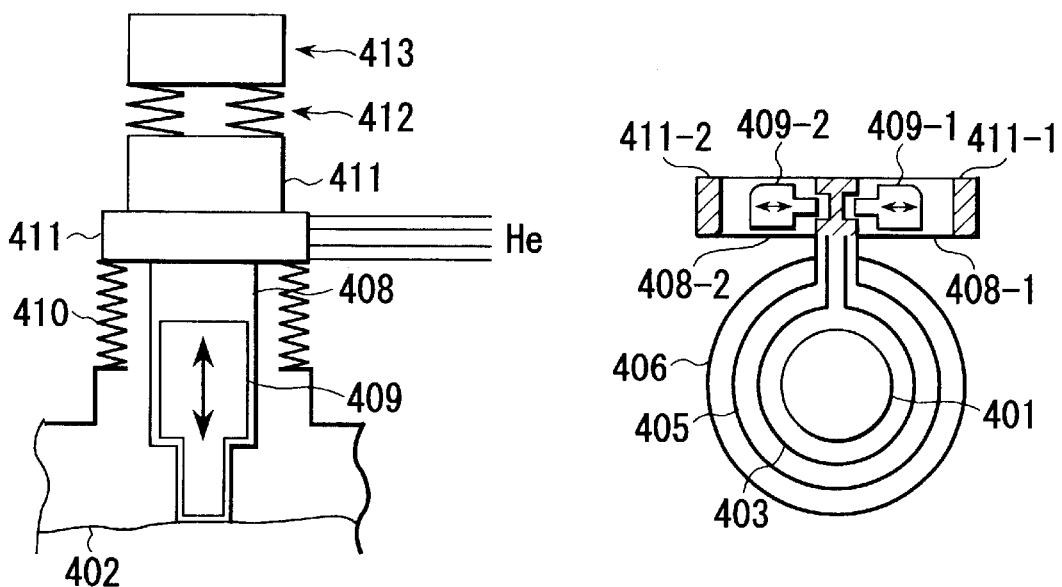
FIG. 23
FIG. 24

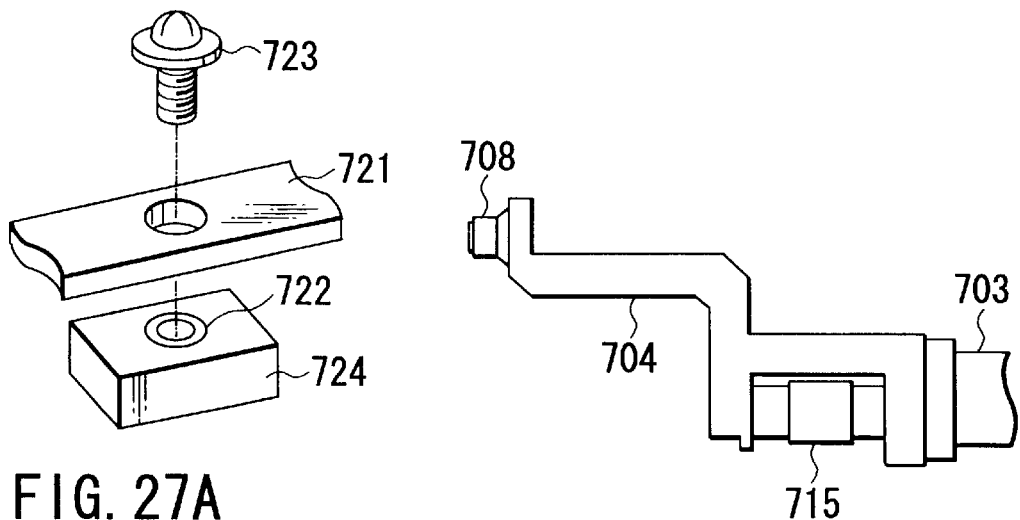
FIG. 27A
FIG. 29
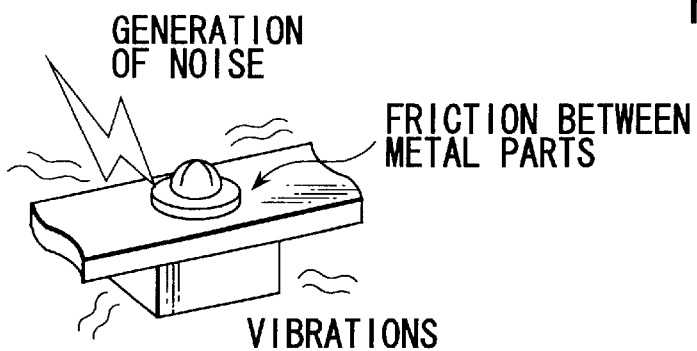
FIG. 27B
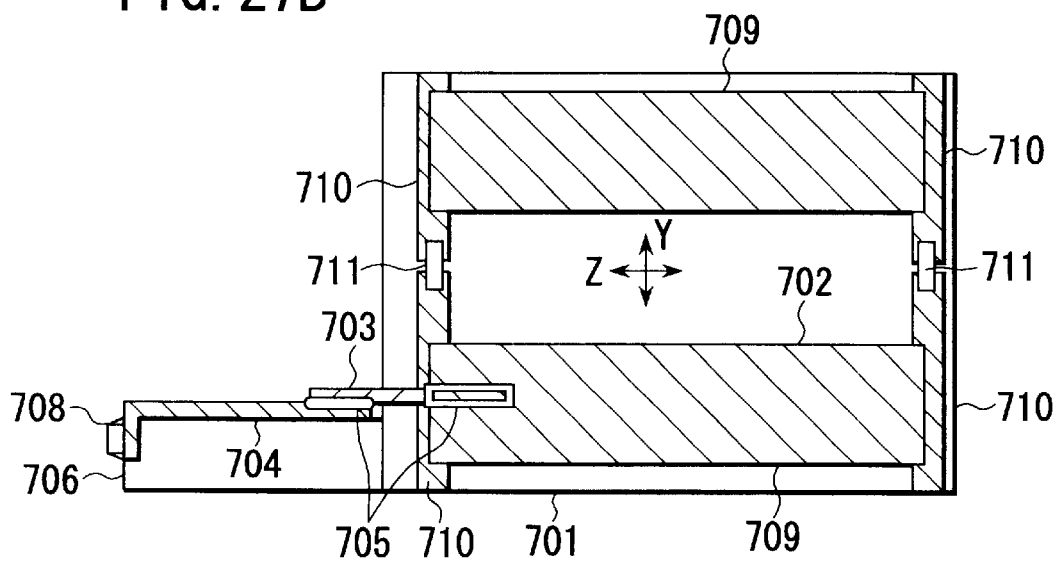
FIG. 28

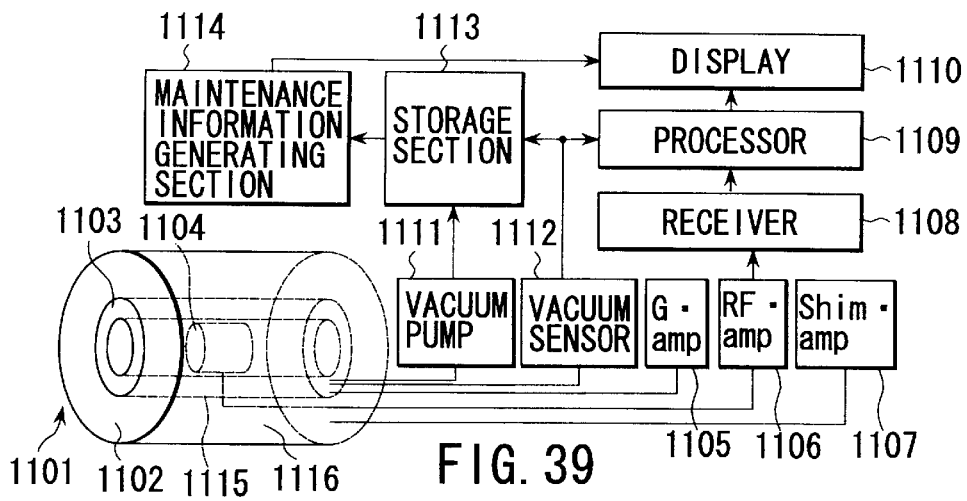
FIG. 39
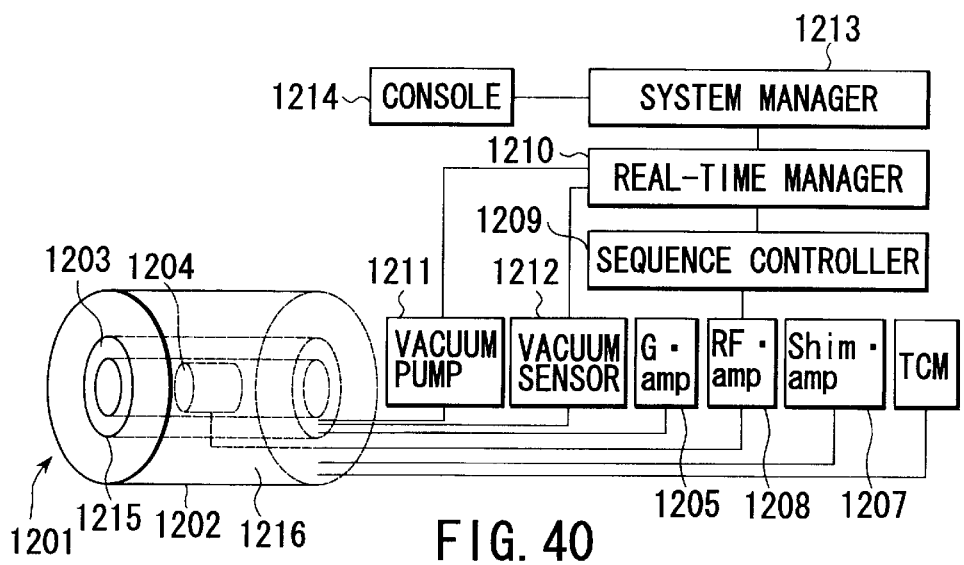
FIG. 40
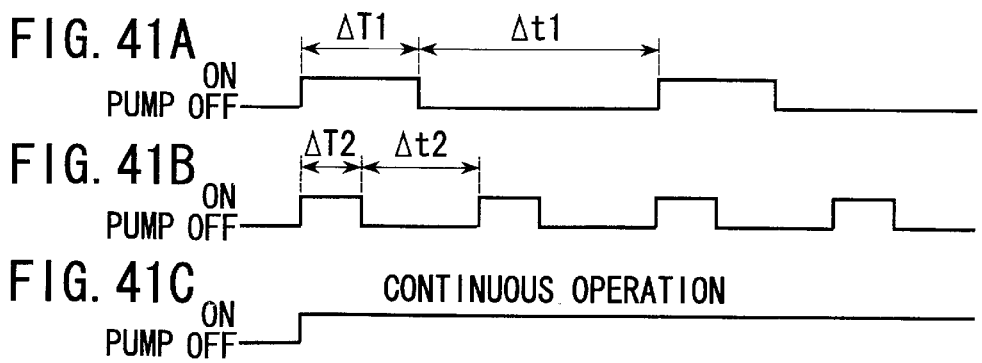

MAGNETIC RESONANCE IMAGING APPARATUS

CROSS-REFERENCE TO RELATED APPLICATIONS

This application is based upon and claims the benefit of priority from the prior Japanese Patent Applications No. 2000-013236, filed Jan. 21, 2000; No. 2000-015419, filed Jan. 25, 2000; No. 2000-131610, filed Apr. 28, 2000; and No. 2000-400361, filed Dec. 28, 2000, the entire contents of which are incorporated herein by reference.

BACKGROUND OF THE INVENTION

The present invention relates to a magnetic resonance imaging apparatus for detecting a magnetic resonance signal of a nuclear spin in an object to be examined and imaging the interior of the object.

A magnetic resonance imaging apparatus (to be referred to as an MRI hereinafter) used as a medical diagnosing apparatus is an apparatus for imaging the interior of an object by detecting a magnetic resonance signal (to be referred to as an MR signal hereinafter) of a nuclear spin in the object. The MRI apparatus can noninvasively image the interior of an object without any radiation exposure, and hence exhibits high clinical utility.

In general, the MRI apparatus has a substantially cylindrical gantry forming an measurement space. In this gantry, a magnetic unit (e.g., superconductive magnet), a gradient field coil, an RF coil, and the like are concentrically arranged. The magnetic unit generates a static field having a very high strength of about several kilogauss to 10 kilogauss (1 tesla) in the measurement space. The gradient field coil generates a linear gradient field superimposed on this static field such that the gradient field changes over time. The RF coil transmits a high-frequency pulse and receives a high-frequency MR signal obtained from the object.

Note that the gradient field coil is comprised of coils of three channels to generate gradient fields in the x-, y-, and z-axis directions. An measurement space is formed in the central portion of these coils, and an object is carried into the space while being laid on the top of a bed. In a static field, a spatial homogeneity of several 10 PPM or less is required. An imaging area in an measurement space requiring this homogeneity often takes a spherical shape having a diameter of about 500 mm.

In imaging operation of obtaining an MR image by the MRI apparatus, the above magnetic unit, gradient field coil, and RF coil are driven in accordance with a desired pulse sequence. More specifically, linear gradient fields in the x-, y-, and z-axis directions are superimposed on an object placed in a static field in accordance with a pulse sequence, and a nuclear spin in the object is magnetically excited by a high-frequency signal having a Larmor frequency. Upon this excitation, an MR signal is generated. This MR signal is detected by the RF coil. By reconstructing the detected MR signal, an MR image of the object is obtained as, for example, a two-dimensional tomographic image.

Recently, there has been a growing need to shorten the time required for imaging in such an MRI apparatus, and a pulse sequence for switching gradient fields of high strength at high speed (inverting polarity at high speed), e.g., a high-speed EPI (Echo Planar Imaging) method, has been put into practice.

When a pulse current flows in the gradient field coil, an electromagnetic force acts on the gradient field coil at the leading edge of a pulse or polarity inversion to make the coil unit mechanically deform owing to the interaction between the electromagnetic force and a static field. As described above, the gradient field coil has coils of three channels which generate gradient fields in the x-, y-, and z-axis directions, and these three gradient field coils are frequently switched at high speed.

The overall coil unit including the gradient field coil and a magnetic vessel for supporting the coil vibrates due to the mechanical distortion of the coil unit. This vibration generates aerial vibration to cause noise. The vibration also generates an impulsive sound. When a gradient field pulse is inverted at high speed, in particular, this vibration increases. As the operation speed increases, therefore, noise increases. The level of this noise becomes 100 dB(A) or more. The noise reverberates in the housing of the gantry in which the object lies or the sealed vessel to produce a larger impulsive sound. This makes the object (patient) feel fear, insecure, and unpleasant.

To prevent an object from being hearing-impaired by this noise, the object is made to wear earplugs or headphones. However, it is troublesome for the patient to wear the earphones or headphones, and they may interfere with imaging operation depending on the imaging position. There have been various proposals for the suppression of the occurrence of such noise. The present applicant has proposed an MRI apparatus designed to prevent air-born or solid-born propagation of noise or vibration by housing a gradient field coil in a sealed vessel with high airtightness as disclosed in Jpn. Pat. Appln. KOKAI Publication No. 63-256146, U.S. Pat. No. 5,793,210, Jpn. Pat. No. 2642348, and Jpn. Pat. Appln. KOKAI Publication No. 10-118043.

In the conventional MRI apparatus having a silencing mechanism, no measures are taken against a case wherein the silencing function is impaired for some reason. For example, the sealed vessel housing the gradient field coil can prevent propagation of noise caused by the gradient field coil because a vacuum is held in the vessel. If the vacuum in the sealed vessel is lost while an MR image of an object (patient) is taken, large noise is produced abruptly. This makes the object feel fear, insecure, and unpleasant, and may impair the hearing of the object.

The vacuum in this sealed vessel can be maintained by reducing the leak amount to zero. In practice, however, current leads for supplying driving currents to the gradient field coil and a cooling system extend through the sealed vessel, and the vessel has many joint portions. External air flows little by little into the sealed vessel mainly through these portions, and hence the vacuum cannot be maintained for a very long period of time. For this reason, a relatively inexpensive rotary vacuum pump is continuously driven to always exhaust internal air to maintain a vacuum in the sealed vessel.

If, however, the vacuum pump is continuously driven, oil and parts deteriorate quickly. This makes it necessary to frequently perform maintenance. In addition, the service life of the vacuum pump is shortened. Furthermore, the power consumption becomes high, and the running cost becomes high.

BRIEF SUMMARY OF THE INVENTION

It is an object of the present invention to reduce noise in imaging operation.

A magnetic resonance imaging apparatus generates an MR signal from an object by applying a gradient field pulse generated by a gradient field coil and a high-frequency magnetic field pulse generated by a high-frequency coil to the object in a static field, and reconstructs an image on the basis of the MR signal. The gradient field coil is housed in a sealed vessel. The internal air in the sealed vessel is exhausted by the pump to prevent noise. By controlling the operation of the pump using a control circuit, noise in imaging operation can be reduced more effectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 19A is a perspective view of a sealed vessel according to the fourth embodiment;

FIG. 19B is a front view of a sealed vessel according to the fifth embodiment;

FIG. 19C is a partial sectional view of the closed vessel according to the fifth embodiment;

FIG. 22 is a longitudinal sectional view of the cryostat of a static field magnet according to the seventh embodiment;

FIG. 23 is a view showing the internal structure of a dynamic vibration absorber in FIG. 22;

FIG. 24 is a view showing the internal structure of a cold head portion in another example of the eighth embodiment;

FIG. 27A is a perspective view showing the principle of the occurrence of noise radio waves in the 10th embodiment;

FIG. 27B is a perspective view showing the principle of the occurrence of noise radio waves in the 10th embodiment;

FIG. 28 is a view showing a tuner copper plate and its connection parts in the 10th embodiment;

FIG. 29 is a view showing an example of how metal parts are connected to each other in the 10th embodiment;

FIG. 39 is a view showing the arrangement of the main part of a magnetic resonance imaging apparatus according to the 15th embodiment;

FIG. 40 is a view showing the arrangement of the main part of the magnetic resonance imaging apparatus according to the 15th embodiment;

FIG. 41A is a timing chart showing the first driving pattern of a vacuum pump in the 15th embodiment;

FIG. 41B is a timing chart showing the second driving pattern of the vacuum pump in the 15th embodiment; and FIG. 41C is a timing chart showing the third driving pattern of the vacuum pump in the 15th embodiment.

DETAILED DESCRIPTION OF THE INVENTION

First Embodiment

Figure 1:
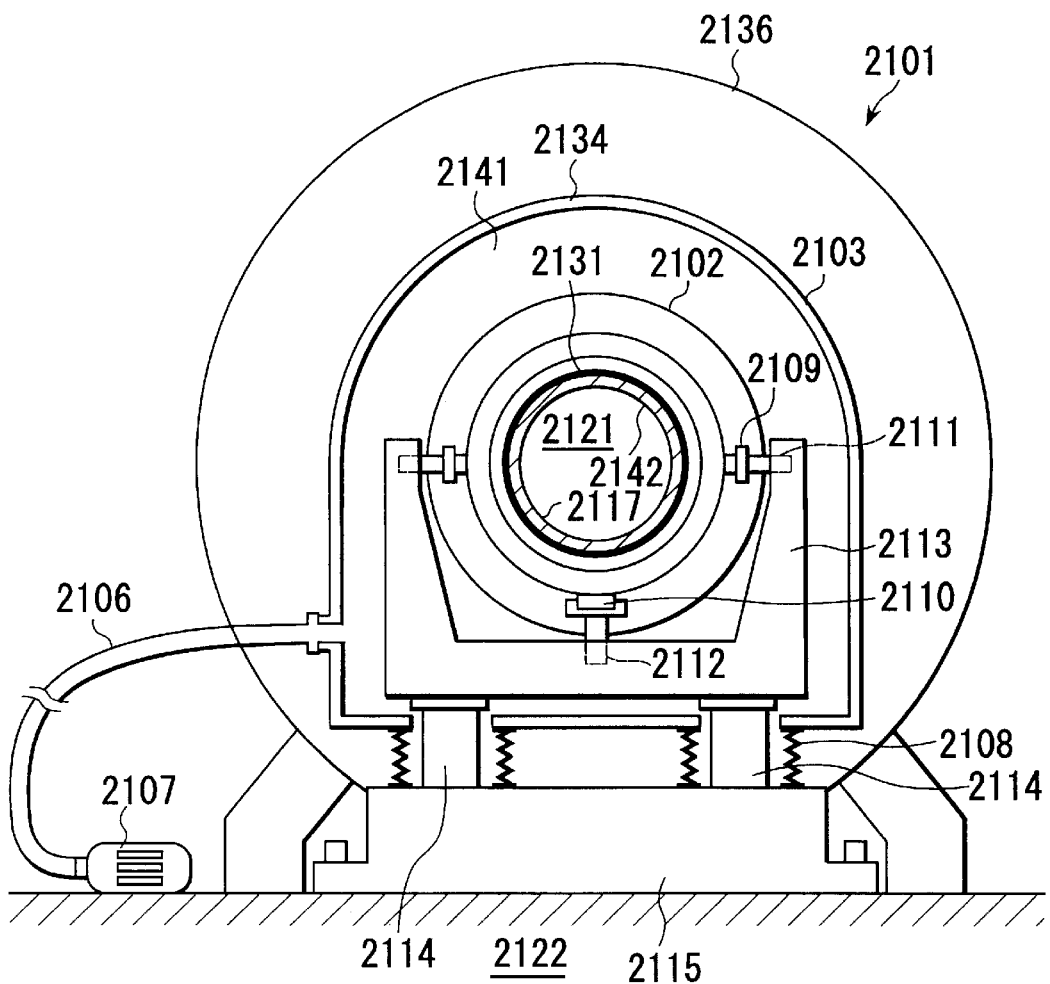
FIG. 1 is a cross-sectional view of the gantry of a magnetic resonance imaging apparatus according to the first embodiment of the present invention.
Figure 2:
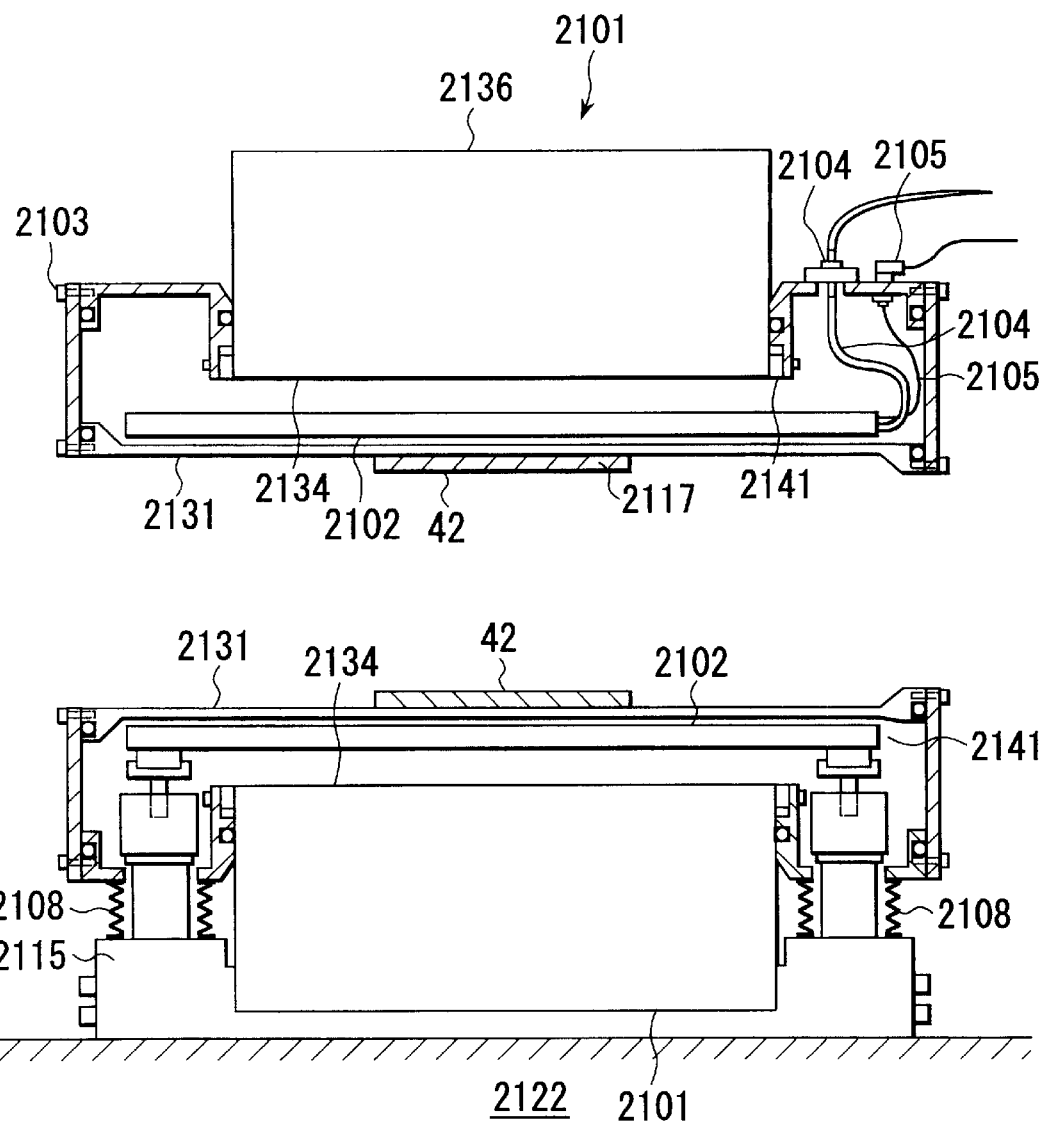
FIG. 2 is a longitudinal sectional view of the gantry of the magnetic resonance imaging apparatus according to the first embodiment.

FIG. 1 is a cross-sectional view of the gantry of a magnetic resonance imaging apparatus according to the first embodiment. FIG. 2 is a longitudinal sectional view of the gantry of the magnetic resonance imaging apparatus according to this embodiment. This gantry is a substantially cylindrical heavy structure including a static field magnetic unit 2101, gradient field coil unit 2141, and RF coil unit 2142 and having an imaging area 2121 in a substantially central portion. The gantry is fixed on a floor 2122 through a base 2115.

The static field magnetic unit 2101 generates a static field in the imaging area 2121, and is comprised of, if it is of a superconductive type, a superconductive coil, a liquid helium vessel housing the superconductive coil, and a sealed vessel 2136 housing the liquid helium vessel. The RF coil unit 2142 applies an RF magnetic field to an object placed in the imaging area, and also holds an RF coil resin-impregnated cylinder 2117 with a cylindrical fiber-reinforced plastic liner 2131. The RF coil resin-impregnated cylinder 2117 is formed by impregnating an RF coil for detecting a magnetic resonance signal emitted from the object with a resin.

The gradient field coil unit 2141 has a gradient field resin-impregnated cylinder 2102 formed by impregnating a so-called active shield type gradient field coil with a resin. This coil is formed by surrounding a main coil with a shield coil. The gradient field resin-impregnated cylinder 2102 is housed in a sealed vessel 2103 so as not to propagate noise caused by the vibrations of the gradient field resin-impregnated cylinder 2102. The inner wall of the sealed vessel 2103 also serves as the liner 2131 of the RF coil unit 2142. In addition, a portion 2134 of the outer wall of the sealed vessel 2103 also serves as the inner wall of the sealed vessel 2136 of the static field magnetic unit 2101.

The sealed vessel 2103 is forcibly evacuated by a vacuum pump 2107 coupled to the sealed vessel 2103 via a vacuum pipe 2106 to maintain a vacuum in the sealed vessel 2103. Note that the vacuum in the sealed vessel 2103 need not be a perfect vacuum; the degree of vacuum at which air-born sound insulation can be provided, e.g., several Torr, is sufficient. Letting P1 be the degree of vacuum of the sealed vessel 2103, a sound insulating effect S can be given by $$S = 20 \log_{10}(P1/760)$$

If the degree of vacuum P1 is 7 Torr, a sound insulating effect of about 40 dB can be obtained. The operation of the vacuum pump 2107 is control to keep the internal pressure in the sealed vessel 2103 below 7 Torr at which a sufficient sound insulating effect of about 40 dB can be obtained. This control will be described in detail later.

The above gradient field coil is connected to an external gradient field power supply (not shown) via a current lead 2104. A cooling water path formed in the gradient field resin-impregnated cylinder 2102 is connected to an external cooling unit via a hose 2105. The gradient field resin-impregnated cylinder 2102 is supported on the base 2115 via antivibration rubber members 2109 and 2110, bolts 2111 and 2112, arm 2113, and shaft 2114 to minimize the mechanical propagation of vibrations of the cylinder. In addition, the shaft 2114 is wound by a bellows 2108 in consideration of assembly facilitation and vacuum maintenance.

Figure 3:
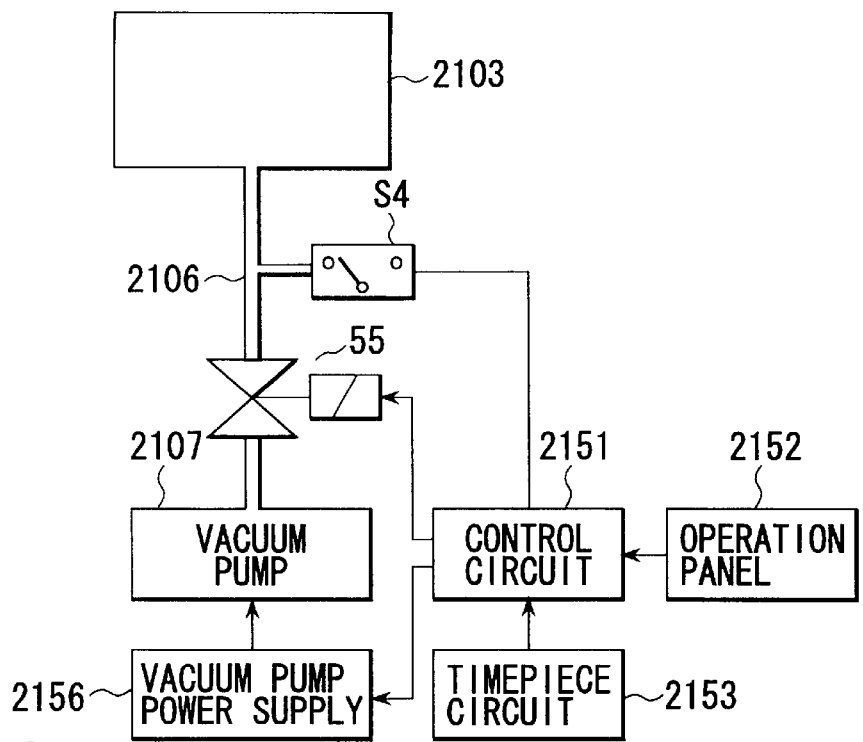
FIG. 3 is a block diagram showing the arrangement of an evacuation system for a sealed vessel in FIG. 2.

FIG. 3 shows the arrangement of an evacuation system for evacuating the sealed vessel 2103 in this embodiment. The operation of this evacuation system is controlled by a control circuit 2151. A vacuum pump power supply 2156, timepiece circuit 2153, pressure sensor 2154, and solenoid valve 2155 are connected to the control circuit 2151. The vacuum pump power supply 2156 supplies driving power to the vacuum pump 2107. The timepiece circuit 2153 outputs real-time data or oscillates pulses at a predetermined period. The pressure sensor 2154 detects the internal pressure in the sealed vessel 2103. The solenoid valve 2155 opens/closes the vacuum pipe 2106. Although not shown, a pressure releasing solenoid valve is interposed between the vacuum pump 2107 and the solenoid valve 2155 to prevent backflow of oil in the vacuum pump 2107 and reduce the load on the vacuum pump 2107 in starting operation.

The control circuit 2151 has three different modes: the sensing control mode of controlling the vacuum pump power supply 2156 on the basis of the internal pressure in the sealed vessel 2103 which is detected by the pressure sensor 2154; the cycle control mode of controlling the vacuum pump power supply 2156 on the basis of an output from the timepiece circuit 2153; and the combination mode of using both the sensing control mode and the cycle control mode. The operator can arbitrarily select one of these three operation modes by operating an operation panel 2152.

A power supply system for this evacuation system is completely independent of a main power supply for the magnetic resonance imaging apparatus body to as to always function regardless of the ON/OFF state of the main power supply for the magnetic resonance imaging apparatus body. More specifically, even when the main power supply for the magnetic resonance imaging apparatus body is turned off, the power supply for the evacuation system is always kept on unless the power switch of the evacuation system is turned off, and evacuating operation continues 24 hours a day in one of three modes (to be described later).

Figure 4A:
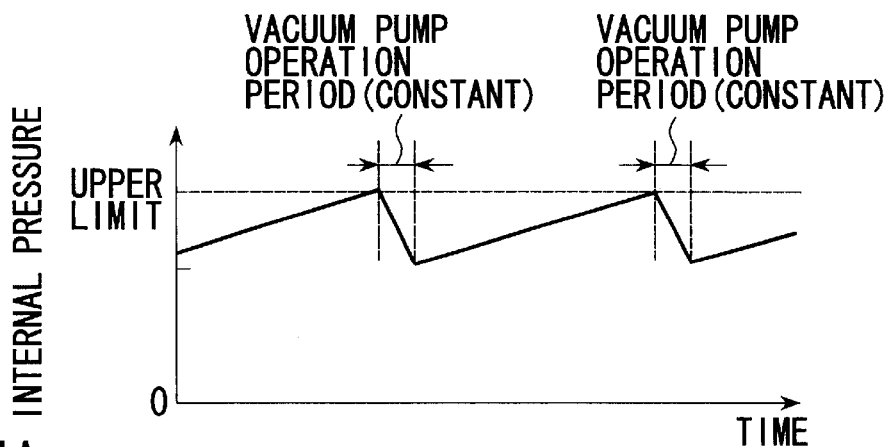
FIG. 4A is a graph showing variations in internal pressure in the sealed vessel over time in sensing control by a control circuit in FIG. 3.

FIG. 4A shows variations in the internal pressure in the sealed vessel 2103 in the sensing control mode over time. In the sensing control mode, the control circuit 2151 compares the internal pressure in the sealed vessel 2103, which is detected by the pressure sensor 2154, with the upper limit (7 Torr) at which the above sufficient sound insulating effect can be obtained. If the internal pressure exceeds the upper limit, the control circuit 2151 controls the vacuum pump power supply 2156 to start supplying driving power to the vacuum pump 2107, and opens the solenoid valve 2155 at the same time or with a slight delay. As a consequence, the vacuum pump 2107 starts to evacuate the sealed vessel 2103.

When the internal pressure in the sealed vessel 2103 decreases below a lower limit of about 5 Torr which slightly exceeds the load capacity of the vacuum pump 2107, or a predetermined period of time has elapsed after the start of the vacuum pump 2107, the control circuit 2151 closes the solenoid valve 2155, and controls the vacuum pump power supply 2156 to stop supplying driving power to the vacuum pump 2107. With this operation, the vacuum pump 2107 stops, and evacuation of the sealed vessel 2103 stops. Note that the operation period of the vacuum pump 2107 is set in advance in accordance with the volume of the sealed vessel 2103, the evacuation capability of the vacuum pump 2107, and the like such that the internal pressure in the sealed vessel 2103 decreases below 7 Torr, e.g., about 5 Torr, at the end of the operation period.

Figure 4B:
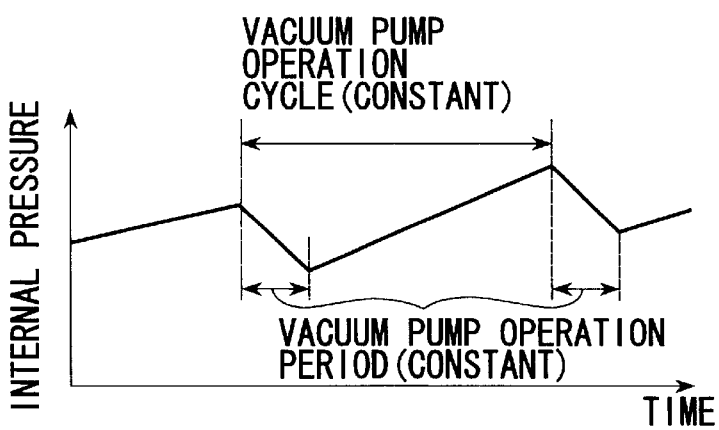
FIG. 4B is a graph showing variations in internal pressure in the sealed vessel over time in cycle control by the control circuit in FIG. 3.

FIG. 4B shows variations in the internal pressure in the sealed vessel 2103 in the cycle control mode over time. In the cycle control mode, if it is determined on the basis of an output from the timepiece circuit 2153 that a predetermined period of time has elapsed after the end of previous evacuating operation, the control circuit 2151 controls the vacuum pump power supply 2156 to start supplying driving power to the vacuum pump 2107, and opens the solenoid valve 2155 at the same time or with a slight delay. With this operation, the vacuum pump 2107 starts, and evacuation of the sealed vessel 2103 starts.

When a predetermined period of time has elapsed after the start of the vacuum pump 2107, the control circuit 2151 closes the solenoid valve 2155, and controls the vacuum pump power supply 2156 to stop supplying driving power to the vacuum pump 2107. With this operation, the vacuum pump 2107 stops, and evacuation of the sealed vessel 2103 stops.

The cycle of evacuating operation is set in advance in accordance with the leakage amount of the sealed vessel 2103 and the like such that the internal pressure in the sealed vessel 2103 does not exceed 7 Torr at the end of the operation period. The operation period of the vacuum pump 2107 is set in advance in accordance with the volume of the sealed vessel 2103, the capability of the vacuum pump 2107, and the like such that the internal pressure in the sealed vessel 2103 decreases below 7 Torr, e.g., about 5 Torr, at the end of the operation period.

In the mode of using both the sensing control mode and the cycle control mode, evacuating operation by the vacuum pump 2107 is periodically performed at a predetermined cycle, and if the internal pressure in the sealed vessel 2103 exceeds 7 Torr during an interval, evacuating operation is executed in the interval. If evacuating operation is periodically performed by the vacuum pump 2107 at a predetermined cycle, and evacuating operation is executed as an interrupt when the internal pressure in the sealed vessel 2103 exceeds 7 Torr during an interval, the start point of an evacuating operation cycle may be reset to the start point of the evacuating operation executed as the interrupt.

As described above, according to this embodiment, since the vacuum pump 2107 intermittently operates, a deterioration in the oil and parts of the vacuum pump 2107 slows down, and the frequency of maintenance decreases accordingly. In addition, since the operation time of the vacuum pump 2107 can be shortened, its service life can be prolonged. Furthermore, the running cost can be reduced by reducing the power consumption. Moreover, in the above cycle control mode, the operation time of the vacuum pump 2107 can be monitored on the maker or maintenance company side, and hence an oil change and repair part replacement for the vacuum pump 2107 can be performed at proper times.

Second Embodiment

Figure 5:
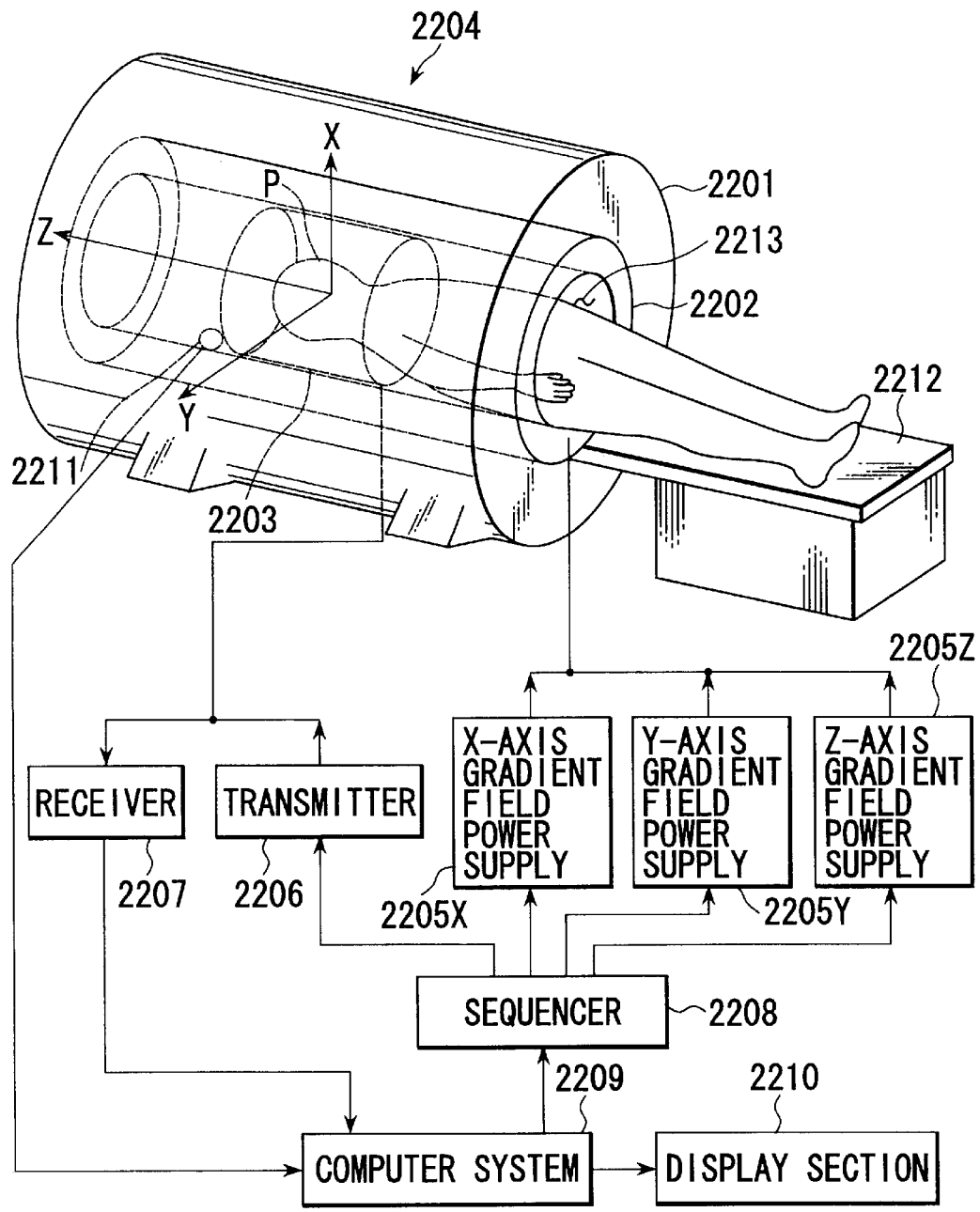
FIG. 5 is a view showing the arrangement of a magnetic resonance imaging apparatus according to the second embodiment.

FIG. 5 shows the schematic arrangement of an MRI apparatus according to an embodiment of the present invention. A magnetic unit 2201 for generating a static field, a gradient field coil 2202 for generating a gradient field, and an RF coil 2203 are concentrically arranged in a gantry 2204. The magnetic unit 2201 is required to have a high magnetic field strength, high homogeneity, and high stability. For example, a superconductive magnet, permanent magnet, or the like is used. Assume that a superconductive magnet is used in this embodiment. The gradient field coil 2202 includes a 3-channel gradient field coil made up of an x-axis gradient field coil, y-axis gradient field coil, and z-axis gradient field coil to generate gradient fields in the x-, y-, and z-axis directions. The x-axis gradient field coil, y-axis gradient field coil, and z-axis gradient field coil are respectively connected to three gradient field power supplies, i.e., an x-axis gradient field power supply 2205$x$, y-axis gradient field power supply 2205$y$, and z-axis gradient field power supply 2205$z$, to be independently driven. These gradient field power supplies 2205$x$, 2205$y$, and 2205$z$ are arranged outside the gantry 2204.

The RF coil 2203 has a transmission coil for transmitting RF pulses and a reception coil for receiving an MR signal. In transmitting RF pulses, the RF coil 2203 is connected to a transmitter 2206 and driven. In receiving an MR signal, the RF coil 2203 is connected to a receiver 2207. The x-axis gradient field power supply 2205$x$, y-axis gradient field power supply 2205$y$, z-axis gradient field power supply 2205$z$, and transmitter 2206 are controlled by a sequencer 2208 in accordance with a predetermined pulse sequence programmed in advance to generate a gradient field Gx in the x-axis direction, a gradient field Gy in the y-axis direction, gradient field Gz in the z-axis direction, and RF pulses. The sequencer 2208 is controlled by a computer system 2209. The computer system 2209 loads the MR signal received by the transmitter 2206, and performs predetermined signal processing for the signal to reconstruct a tomographic image of the object. The computer system 2209 then displays the reconstructed tomographic image on a display section 2210. The transmitter 2206, receiver 2207, sequencer 2208, computer system 2209, display section 2210, and the like are arranged in a computer unit provided independently of the gantry 2204. A sensor 2211 forming the main part of this embodiment is arranged in, for example, the measurement space in the gantry 2204. An output signal from the sensor 2211 is supplied to the computer unit. Note that an object P is inserted into a hollow portion 2213 serving as an measurement space formed in the gantry 2204 and positioned in an imaging area while being placed on a bed 2212.

Figure 6:
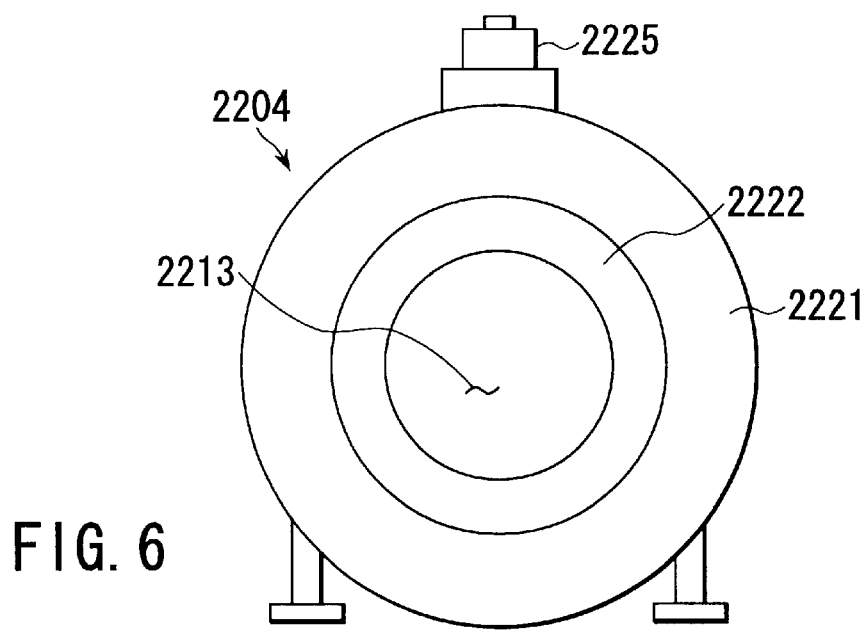
FIG. 6 is a front view of a gantry in the second embodiment.
Figure 7:
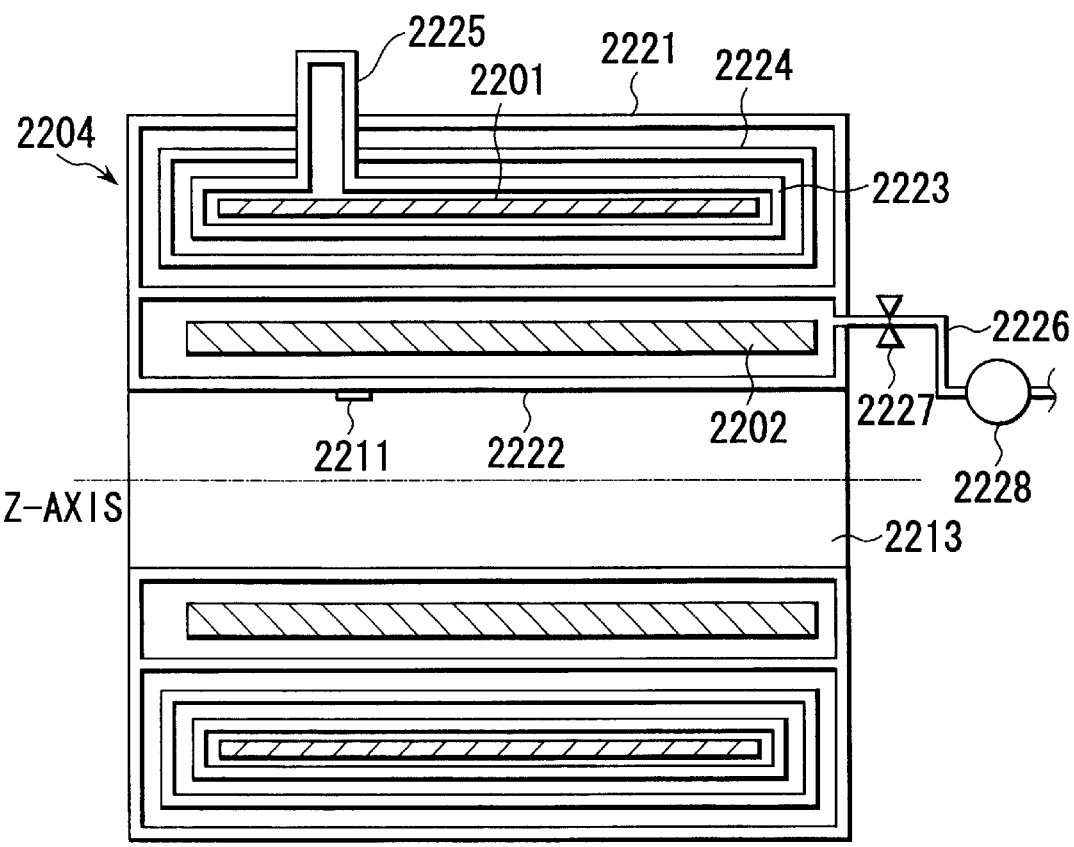
FIG. 7 is a longitudinal sectional view of the gantry in the second embodiment.

The arrangement of the gantry 2204 will be described next. FIG. 6 is a front view of the gantry 2204. FIG. 7 is a longitudinal sectional view of the gantry 2204 when viewed from the side surface side. The gantry 2204 has two hollow, cylindrical sealed vessels 2221 and 2222 that are arranged coaxially. The magnetic unit 2201 for generating a static field is housed in the outer sealed vessel 2221. The gradient field coil 2202 for generating a gradient field is housed in the inner sealed vessel 2222. These sealed vessels 2221 and 2222 are made of a nonmagnetic material. For example, the outer sealed vessel 2221 is made of aluminum, and the inner sealed vessel 2222 is made of FRP (Fiber Reinforced Plastics). To set the magnetic unit 2201 in a superconductive state, its surroundings must be maintained at a very low temperature of about 4K. For this purpose, a high vacuum of 10 to 3 Torr or less (1 atmospheric pressure equal to 760 Torr) is generally maintained in the sealed vessel 2221. The magnetic unit 2201 is housed in a refrigerant bath 2223 together with a refrigerant such as liquid helium. The refrigerant bath 2223 is surrounded with a heat radiation shield 2224 and housed in the sealed vessel 2221. Note that the refrigerant bath 2223 has an injection port 2225 to allow liquid helium or the like to be externally injected. The injection port 2225 protrudes outside from the gantry 2204 through the sealed vessel 2221.

The gradient field coil 2202 is supported by a support member in the inner sealed vessel 2222 such that the position of the coil 2202 can be adjusted in the x, y, and z directions and the coil 2202 does not come into contact with the sealed vessel 2222. A vacuum pump 2228 is connected to the sealed vessel 2222 via a vacuum pipe 2226 and solenoid valve 2227. The vacuum pump 2228 is capable of evacuating the sealed vessel 2222 to a vacuum of about $10^{-1}$ to $10^{-2}$ Torr. The degree of vacuum in the sealed vessel 2222 is always monitored by a vacuum gage. When the degree of vacuum reaches an allowable lower limit, the vacuum pump 2228 is driven. When the degree of vacuum reaches an upper limit, the vacuum pump 2228 is stopped. Note that solenoid valve 2227 prevents air from flowing into the sealed vessel 2222 while the vacuum pump 2228 is stopped. A degree of vacuum P1 in the sealed vessel 2222 and a sound insulating effect S have the following relationship:

$$S = 20 \log_{10}(P1/760) \qquad (1)$$

If, therefore, the degree of vacuum P1 in the sealed vessel 2222 is 7.6 Torr, the sound insulating effect S becomes 40 dB. AS is obvious from this, a degree of vacuum of about several Torr suffices to insulate noise from the gradient field coil 2202.

The noise meter (sensor) 2211 is arranged in the cylindrical measurement space 2213 in the sealed vessels 2221 and 2222 to detect a noise level in the cylindrical imaging area 2213. More specifically, the sensor 2211 is mounted on the inner wall of the sealed vessel 2222 at a position slightly shifted from the Z-axis center of the measurement space 2211. Furthermore, to detect noise originating from the gradient field coil 2202, which is switched at high speed, at substantially the same level as that of noise heard by the object P, the sensor 2211 is stuck to the side surface at substantially the same height as that of the ears of the object P.

The vibrator of the sensor 2211 is formed by a piezoelectric element so as not to distort a magnetic field distribution. A signal from the sensor 2211 is supplied to a computer unit placed outside the gantry 2204. Note that the piezoelectric element is suitably used as a sensor for converting a sound, i.e., air vibrations, into an electrical signal even in an environment in which a strong magnetic field exists.

Figure 8:
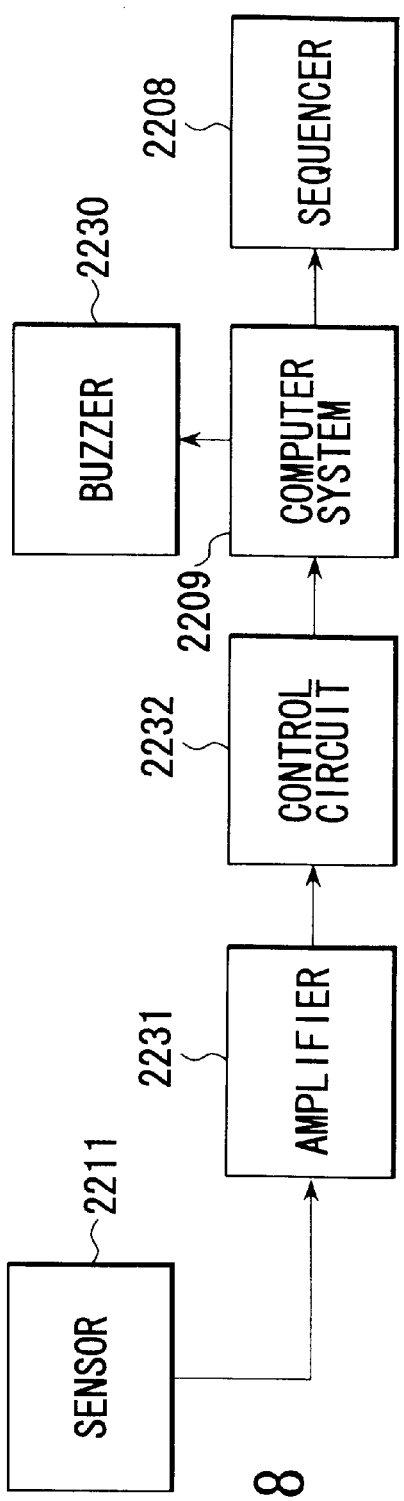
FIG. 8 is a block diagram showing a noise control system in the second embodiment.
Figure 9:
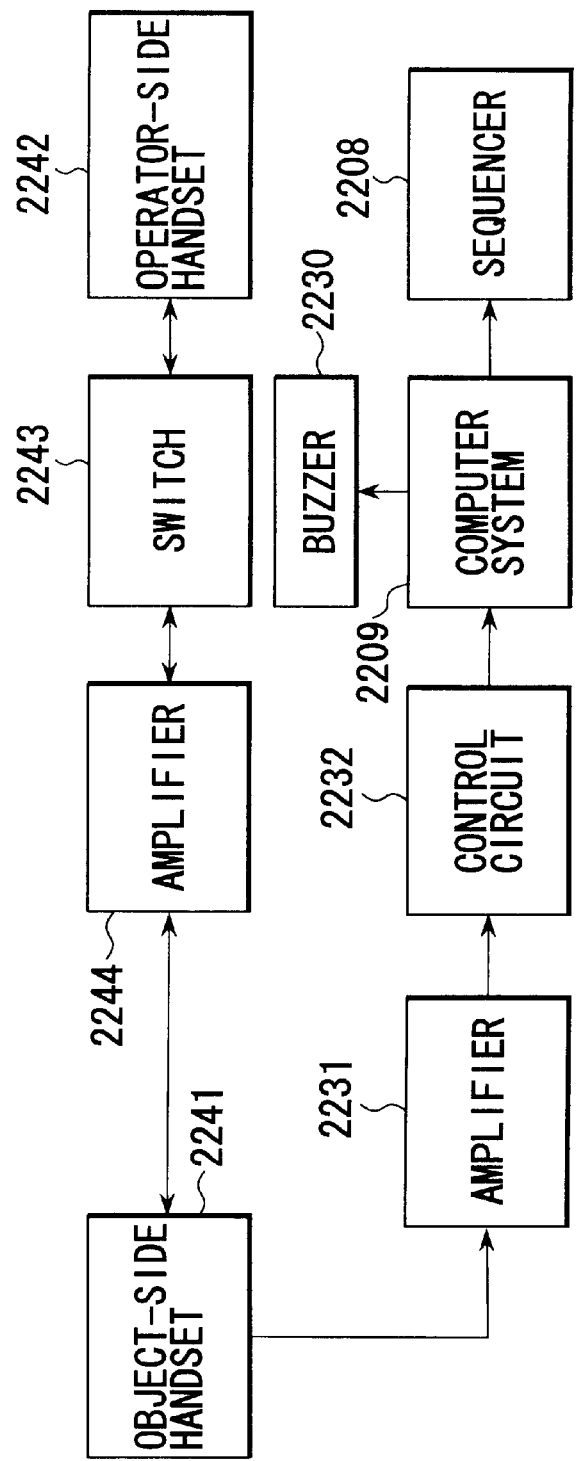
FIG. 9 is a block diagram showing a speech communication system in the second embodiment.

The function of the sensor 2211 will be described next with reference to FIGS. 8 and 9. FIG. 8 is a system diagram showing the main part of the computer unit provided in the magnetic resonance imaging apparatus according to this embodiment. FIG. 9 is a system diagram showing the main part of another example of the computer unit. Referring to FIG. 8, an output signal from the sensor 2211 is supplied to a control circuit 2232 via an amplifier 2231. The control circuit 2232 compares the amplified sensor output (noise level) with a threshold. If the sealed vessel 2222 is set in a nearly vacuum state, air-born sound propagation hardly occurs. For this reason, noise caused by the gradient field coil 2202 disposed in the sealed vessel 2222 does not leak out of the sealed vessel 2222, and the object can P hardly hear it. If, therefore, the noise level detected by the sensor 2211 is less than a threshold, the control circuit 2232 dose not output any signal or outputs a signal indicating that the noise level is less than the threshold. If the noise level detected by the sensor 2211 is equal to or higher than the threshold, the control circuit 2232 outputs a signal to the computer system 2209. At this time, the computer system 2209 outputs a driving signal to a buzzer 2230 to warn the operator that the noise level is abnormally high, and/or outputs message data to the display. In addition, the computer system 2209 outputs an interlock control signal to the sequencer 2208. Upon reception of the interlock control signal, the sequencer 2208 stops supplying currents to the gradient field coil 2202 and transmitter 2206. That is, MRI scan stops.

In the embodiment of the control section shown in FIG. 8, as the sensor 2211, an acceleration detector for detecting an acceleration and converting it into an electrical signal may be used instead of the piezoelectric element. With the use of this acceleration detector, abnormal vibrations due to solid-born sound propagation caused in the structure when the gradient field coil 2202 is mechanically brought into contact with the sealed vessel 2222 for some reason can be detected as well as an increase in noise by air-born sound propagation with a decrease in the degree of vacuum. In this case, it is assumed that the mounting position of the gradient field coil 2202 in the sealed vessel 2222 has shifted. This makes it possible to quickly trigger inspection/adjustment so as to obtain good MR images and to prevent damage to the gradient field coil 2202 itself. In addition, the sensor 2211 may be a vacuum gage for monitoring the degree of vacuum in the sealed vessel 2222. In this case, when the pressure in the sealed vessel 2222, which is compared by the control circuit 2232, exceeds a predetermined threshold, the computer system 2209 outputs a warning and stops scanning. Since an increase in pressure can be checked before this operation, for example, an abnormal portion can be found or the availability factor of the pump 2228 can be decreased before generation of noise.

As shown in FIG. 9, the object-side handset of an intercom which is generally mounted in the MRI apparatus to allow speech communication between the object (patient) undergoing MRI examination and the operator also serves as a sensor for detecting noise. More specifically, the intercom is comprised of an object-side handset 2241 installed near the imaging area in the measurement space in the gantry 2204 in which the object P is placed, an operator-side handset 2242 installed in an operation room, a switch 2243 for switching transmission and reception in speech communication, and an amplifier 2244. The switch 2243 is designed such that voices from the object-side handset 2241 reach the operator-side handset 2242 in normal operation, and when the operator is to give an instruction to the object, the operator operates the switch 2243 to send voices from the operator-side handset 2242 to the object-side handset 2241. An output from the object-side handset 2241 is branched to be supplied to the amplifier 2231, as in the case shown in FIG. 8, and is compared with a threshold by the control circuit 2232. The comparison result is supplied to the computer system 2209. In this case, the handset 2241 has the same function as in the case wherein a piezoelectric element is used as the sensor 2211, and hence no special sensor need be used. This makes it possible to simplify the arrangement. In addition, if, for example, abnormal noise is generated, since this noise is transmitted to the operator-side handset 2242, measures against abnormal noise, e.g., stopping the system, can be easily taken.

Third Embodiment

Figure 10:
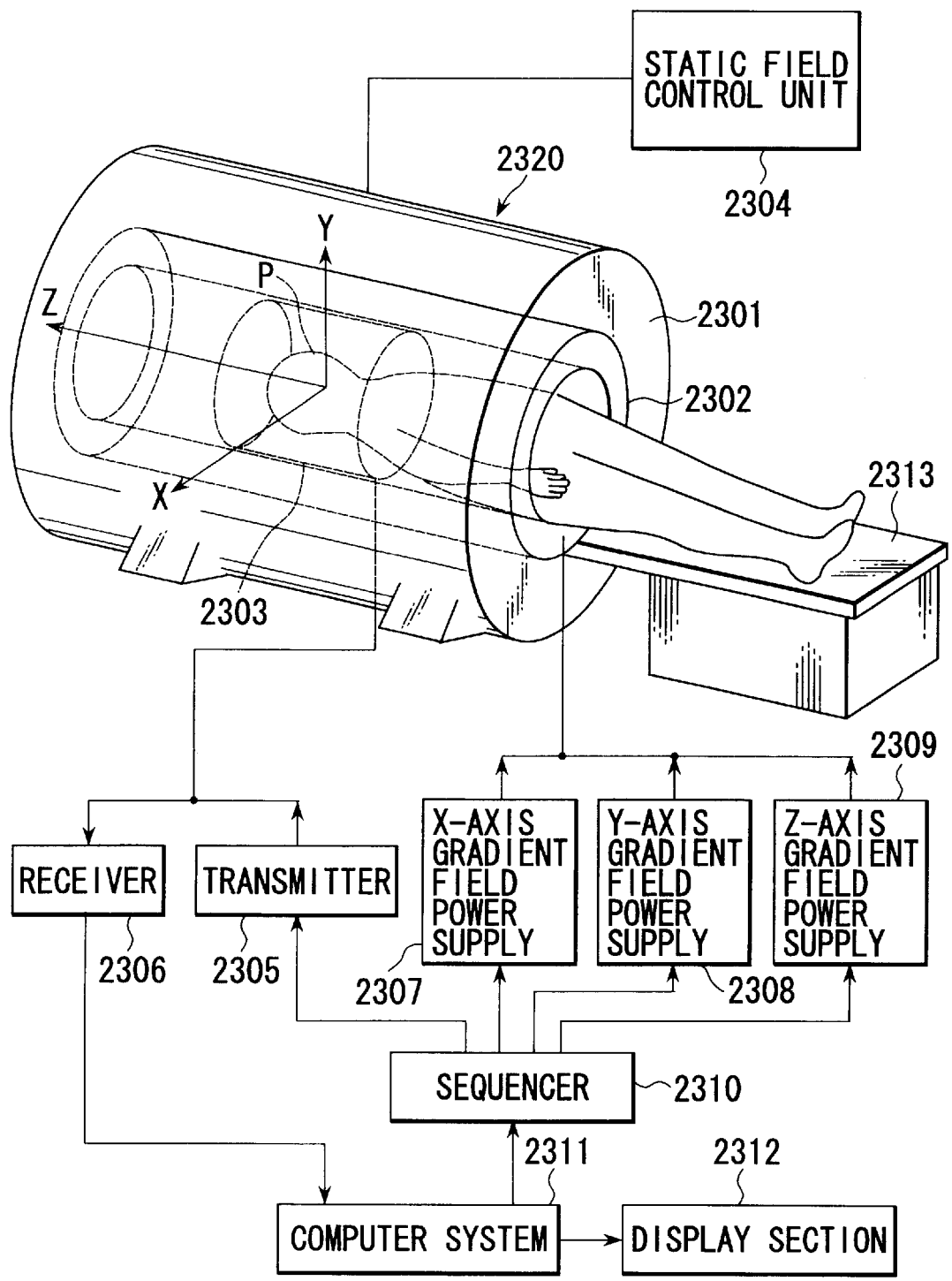
FIG. 10 is a view showing the arrangement of a magnetic resonance imaging apparatus according to the third embodiment.

FIG. 10 is a block diagram showing the schematic arrangement of a magnetic resonance imaging apparatus according to the third embodiment of the present invention. A static field magnet 2301, X-axis/Y-axis/Z-axis gradient field coil 2302, and transmission/reception coil 2303 are arranged in a gantry 2320. The transmission/reception coil 2303 is embedded in the top of a bed 2313. Alternatively, the transmission/reception coil 2303 may be directly mounted on an object. In place of such a transmission/reception coil, different coils may be used for transmission and reception, respectively. The static field magnet 2301 as a static field generator is formed by using, for example, a superconductive coil or normal conductive coil. The X-axis/Y-axis/Z-axis gradient field coil 2302 is a coil for generating an X-axis gradient field Gx, Y-axis gradient field Gy, and Z-axis gradient field Gz. The transmission/reception coil 2303 is used to generate a high-frequency (RF) pulse as a selective excitation pulse for selecting a slice and detect a magnetic resonance signal (MR signal) generated by magnetic resonance. An object P placed on the top of the bed 2313 is inserted into an imaging area (a spherical area in which an imaging magnetic field is formed) in the gantry 2320.

The static field magnet 2301 is driven by a static field control unit 2304. In the RF transmission mode, the transmission/reception coil 2303 is driven by a transmitter 2305. In the magnetic resonance signal detection mode, the transmission/reception coil 2303 is coupled to a receiver 2306. The X-axis/Y-axis/Z-axis gradient field coil 2302 is driven by an X-axis gradient field power supply 2307, Y-axis gradient field power supply 2308, and Z-axis gradient field power supply 2309.

The X-axis gradient field power supply 2307, Y-axis gradient field power supply 2308, Z-axis gradient field power supply 2309, and transmitter 2305 are driven by a sequencer 2310 in accordance with a predetermined sequence to generate the X-axis gradient field Gx, Y-axis gradient field Gy, Z-axis gradient field Gz, and high-frequency (RF) pulse in accordance with a predetermined pulse sequence (to be described later). In this case, the X-axis gradient field Gx, Y-axis gradient field Gy, Z-axis gradient field Gz are mainly used as a phase encoding gradient field Ge, readout gradient field Gr, and slicing gradient field Gs, respectively. A computer system 2311 drives/controls the sequencer 2310. In addition, the computer system 2311 loads the magnetic resonance signal received by the receiver 2306 and performs predetermined signal processing for it to generate a tomographic image of the object, and displays it on a display section 2312.

Figure 11:
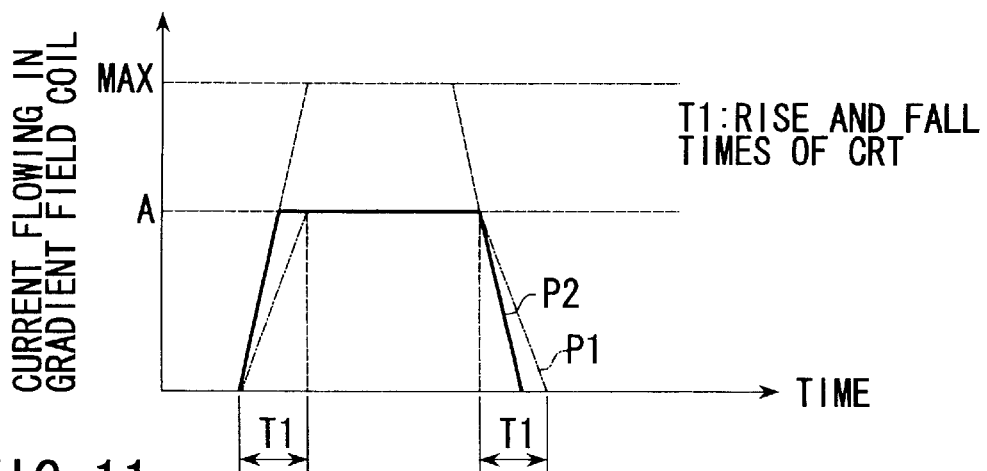
FIG. 11 is a graph showing the waveform of a current flowing in a gradient field coil in the third embodiment.

Two methods are used to make a gradient field rise and fall: the constant slew rate method (CSR) of making a gradient field rise and fall with a constant amount of change in gradient field per unit time, i.e., at a constant slew rate (dB/dt); and the constant rise time method (CRT) of making a gradient field rise and fall at a constant gradient field rise time. FIG. 11 is a graph showing the typical temporal waveform of a current supplied to the X-axis/Y-axis/Z-axis gradient field coil 2302 to generate a gradient field pulse. Reference symbol P1 denotes the waveform of a current that is made to rise by the constant rise method; and P2, the waveform of a current that is made to rise by the constant slew rate method.

The gradient field current P2 based on the constant slew rate method rises at a constant slew rate up to a target value A even if the target value A changes, and falls at a constant slew rate from the target value A. The rise time and fall time therefore change depending on the target value A.

The gradient field current P1 based on the constant rise time method rises from zero to the target value A in a constant period of time even if the target value A changes, and falls from the target value A to zero in a constant period of time. The slew rate therefore changes depending on the target value A.

Figures 12A, 12B:
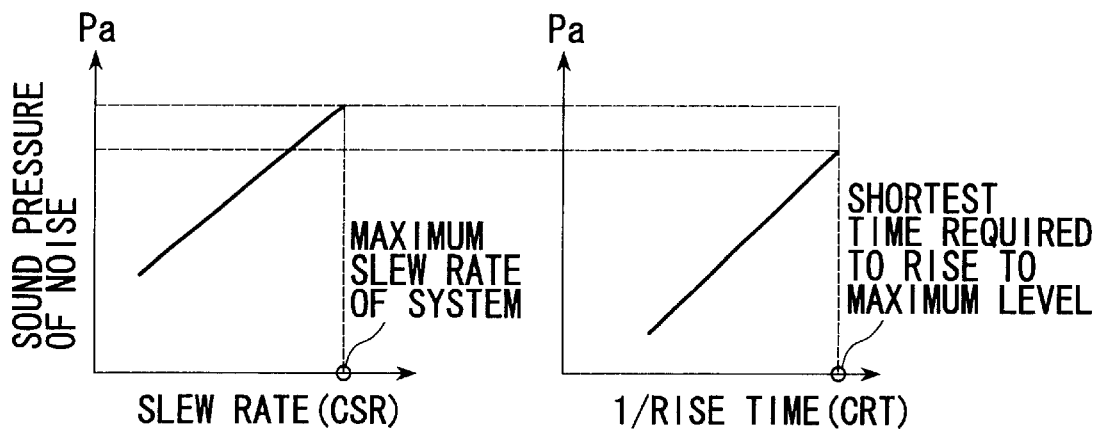
FIG. 12A is a graph showing the correlation between the constant slew rate (CSR) and the noise level in the third embodiment.
FIG. 12B is a graph showing the correlation between the constant rise time (CRT) and the noise level in the third embodiment.

In general, as shown in FIG. 12A, in the constant slew rate method, the slew rate is fixed to the maximum slew rate determined by various conditions such as the output capability of each gradient field power supply and the inductance of the gradient field coil 2302. A pulse sequence is set in accordance with this maximum slew rate and target value A. In the constant slew rate method, therefore, as the target value A changes, the rise time and fall time change, but the shortest rise and fall times are ensured for the respective target values A.

In contrast to this, as shown in FIG. 12B, in the constant rise time method, the rise and fall times are fixed, and a pulse sequence is set to make a coil current value rise/fall in the fixed time. If, therefore, the target value A changes, the slew rate changes, but the same rise and fall times are always ensured for the respective target values A. In addition, the rise/fall time is set to the time required to make a current value rise to the maximum current value that can be output from each gradient field power supply at the maximum slew rate determined by various conditions such as the output capability of each gradient field power supply and the inductance of the gradient field coil 2302. If, therefore, the target value A is smaller than the maximum current value, the corresponding slew rate is always lower than the maximum slew rate.

In most cases, the target value A is set to be smaller than the maximum current value. In most cases, therefore, the slew rate in the constant rise time method is lower than that in the constant slew rate method.

As is known, noise is caused when the bobbin of the gradient field coil 2302 deforms. This noise level increases as this deformation rate increases. The noise level therefore increases as the slow rate increases.

In most cases, therefore, the noise level in the constant rise time method is lower than that in the constant slew rate method by, for example, several dB to several ten dB.

In this embodiment, the constant rise time method and constant slew rate method can be selectively used. Typically, the computer system 2311 stores various kinds of pulse sequence databases, and the pulse sequence database selected by the operator is updated in the constant rise time method or constant slew rate method selected by the operator in accordance with various parameters such as the target value A. The sequencer 2310 controls the operations of the gradient field power supplies 2307, 2308, and 2309, transmitter 2305, and receiver 2306 in accordance with this updated pulse sequence.

The constant rise time method or constant slew rate method may be selected according to the following criteria. If a reduction in noise is a principal objective, the constant rise time method is selected. If a reduction in imaging time is a principal objective, the constant slew rate method is selected. Such criteria for selection should be left to the user's discretion.

Obviously, instead of updating such a database, many pulse sequences generated in the constant slew rate method in accordance with various parameters and many pulse sequences generated in the constant rise time method in accordance with various parameters may be prepared and stored in the internal memory or the like in the computer system 2311 to be selectively used.

As described above, according to this embodiment, since the constant slew rate method and constant rise time method can be selected, and hence can be arbitrarily used in accordance with the above criteria for selection.

As described above, the noise level changes depending on the slew rate. To decrease the noise level, a low slew rate may be set in the constant slew rate method, and a pulse sequence may be modified in accordance with the low slew rate. In the constant rise time method, to decrease the noise level, the rise and fall times may be set to be long, and a pulse sequence may be modified in accordance with the long rise and fall times.

Figure 13:
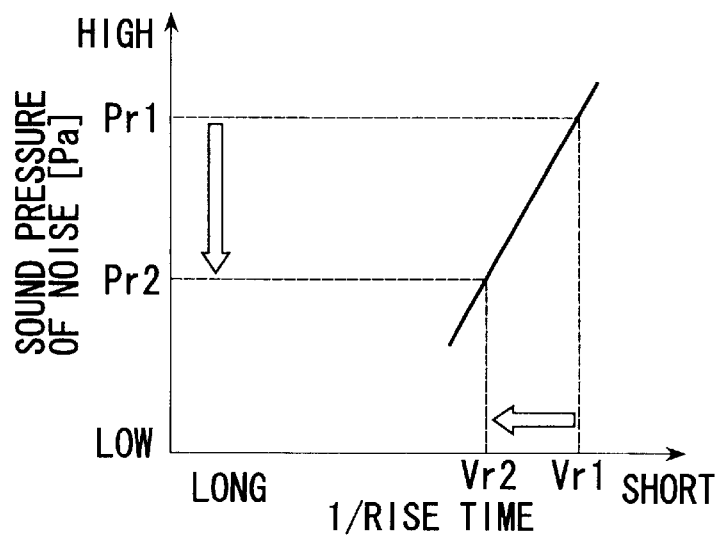
FIG. 13 is a graph showing the correlation between the constant rise time (CRT) and the noise level in the third embodiment.

FIG. 13 shows the correlation between the rise/fall time and the noise level (sound pressure "Pa"). In base data, the rise/fall time is set to Vr1. To decrease the noise level, the rise/fall time is prolonged from Vr1 to Vr2. This makes it possible to reduce the noise level from Pr1 to Pr2.

According to the examination made by the present inventors, the noise reducing effect obtained by prolonging the rise/fall time almost reaches its limit at a certain rise/fall time. More specifically, an increase in noise reducing effect cannot be expected even if the rise/fall time is prolonged beyond 1.2 to 1.5 ms. The limit of the prolongation of the rise/fall time is set to a specific value in the range of 1.2 to 1.5 ms.

More specifically, the rise/fall time is prolonged by, for example, inputting a numerical value or automatically setting a recommended value or the above limit.

Figure 14:
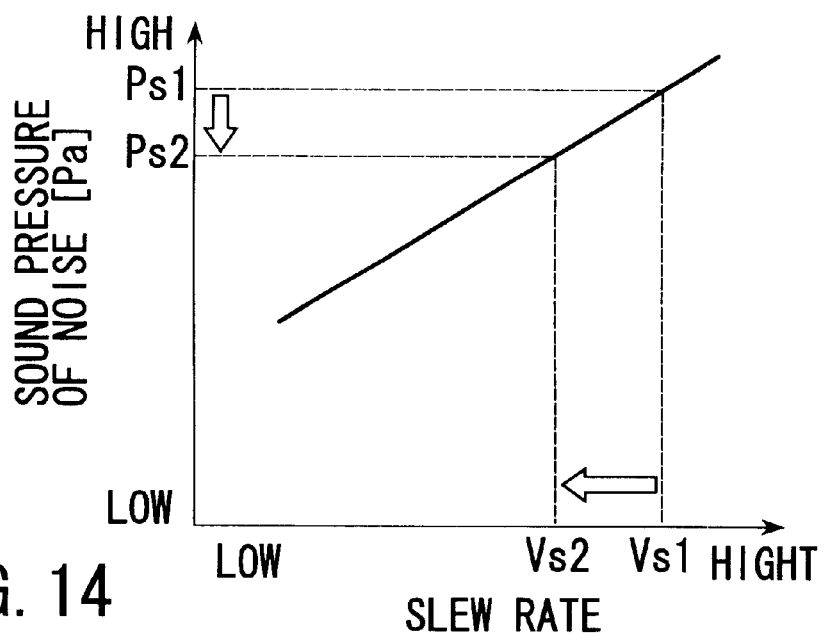
FIG. 14 is a graph showing the correlation between the constant slew rate (CSR) and the noise level in the third embodiment.

FIG. 14 shows the correlation between the slew rate and the noise level (sound pressure "Pa") in the constant slew rate method. In base data, the slew rate is set to Vs1. To decrease the noise level, the slew rate is decreased from Vs1 to Vs2. This makes it possible to reduce the noise level from Ps1 to Ps2.

In the constant slew rate method, as in the constant rise time method, the need to make a gradient field rise/fall at the maximum slew rate is not very high in normal imaging operation. A minimum necessary slew rate should be set for imaging operation in consideration of a reduction in noise.

As shown in the graph of FIG. 14, for example, when the current slew rate is Vs1, and the minimum necessary slew rate for the corresponding imaging operation is Vs2, the slew rate is decreased from Vs1 to Vs2. As a consequence, the sound pressure of noise can be reduced from Ps1 to Ps2.

Note that the rise/fall times or slew rates may be switched by one of two types of methods: an automatic switching method and manual switching method. In the automatic switching method, the minimum necessary rise/fall time or slew rate for each imaging operation is obtained in advance, and the obtained values are automatically switched in accordance with selection of imaging operation. In an implementation, a plurality of pulse sequences preset in correspondence with rise/fall times and slew rates are selected/switched.

In the manual switching method, the operator manually switches the rise/fall time or slew rate to a desired value through an input device.

In this manner, more precise noise/driving control can be performed in both the constant slew rate method and the constant rise time method.

According to the above description, noise reduction is realized by decreasing the slew rate and prolonging the rise time (fall time). As the slew rate decreases, a higher noise reducing effect can be expected, but the imaging time is prolonged. Likewise, as the rise time (fall time) is prolonged, a higher noise reducing effect can be expected, but the imaging time is prolonged. In this case, therefore, an optimal slew rate and optimal rise time are set in consideration of both noise reduction and imaging time.

Figure 15:
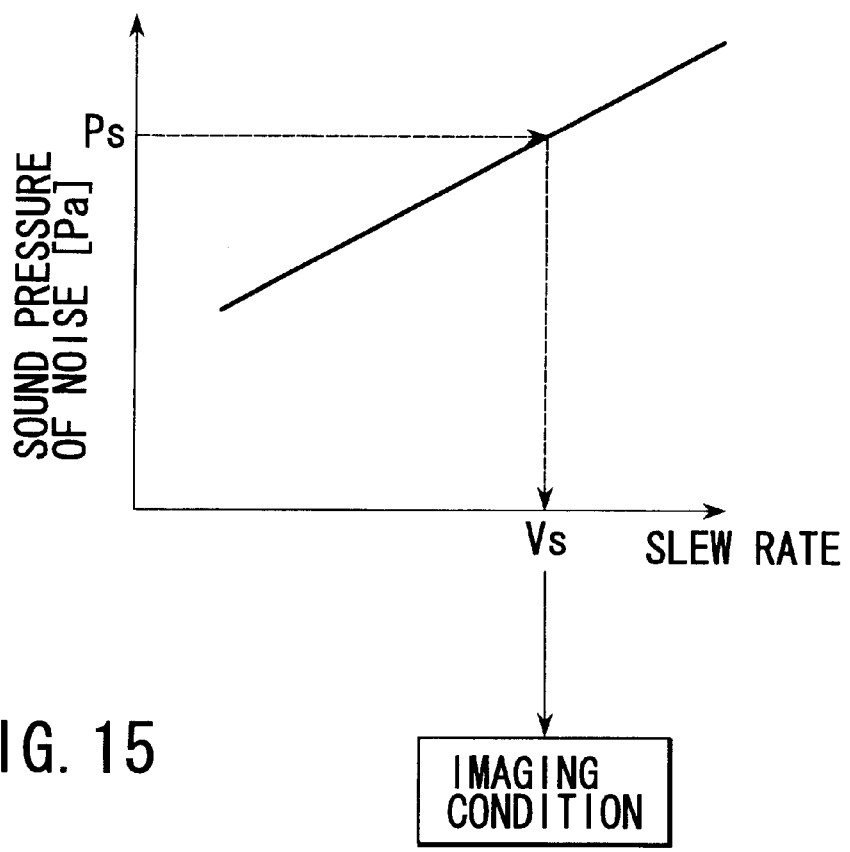
FIG. 15 is a graph showing the correlation between the noise allowable level and the slew rate in the third embodiment.

As shown in FIG. 15, there is a correlation between the slew rate and the noise level. This correlation can be measured by a simulation or actual measurement. If, therefore, a noise level is designated, a corresponding slew rate can be specified. A rise/fall time can also be obtained from a specified slew rate and target current value.

Although the limit of tolerable noise in MRI operation greatly varies among individuals, there is a report which holds that this limit is 99 dB. A slew rate and rise time are therefore set in accordance with 99 dB. Alternatively, the correlation data may be stored, and the operator may set a slew rate and rise/fall time in accordance with a designated noise level. In this case, the operator should consider other imaging conditions, e.g., a minimum FOV (Field Of View), minimum slice thickness, and maximum number of slices. Alternatively, a plurality of pulse sequences in which noise can be reduced below allowable noise levels may be set in correspondence with the respective allowable noise levels, and a list of a plurality of pulse sequences is displayed in accordance with a selected allowable noise level to allow the operator to select a desired sequence.

Fourth Embodiment

Figure 16:
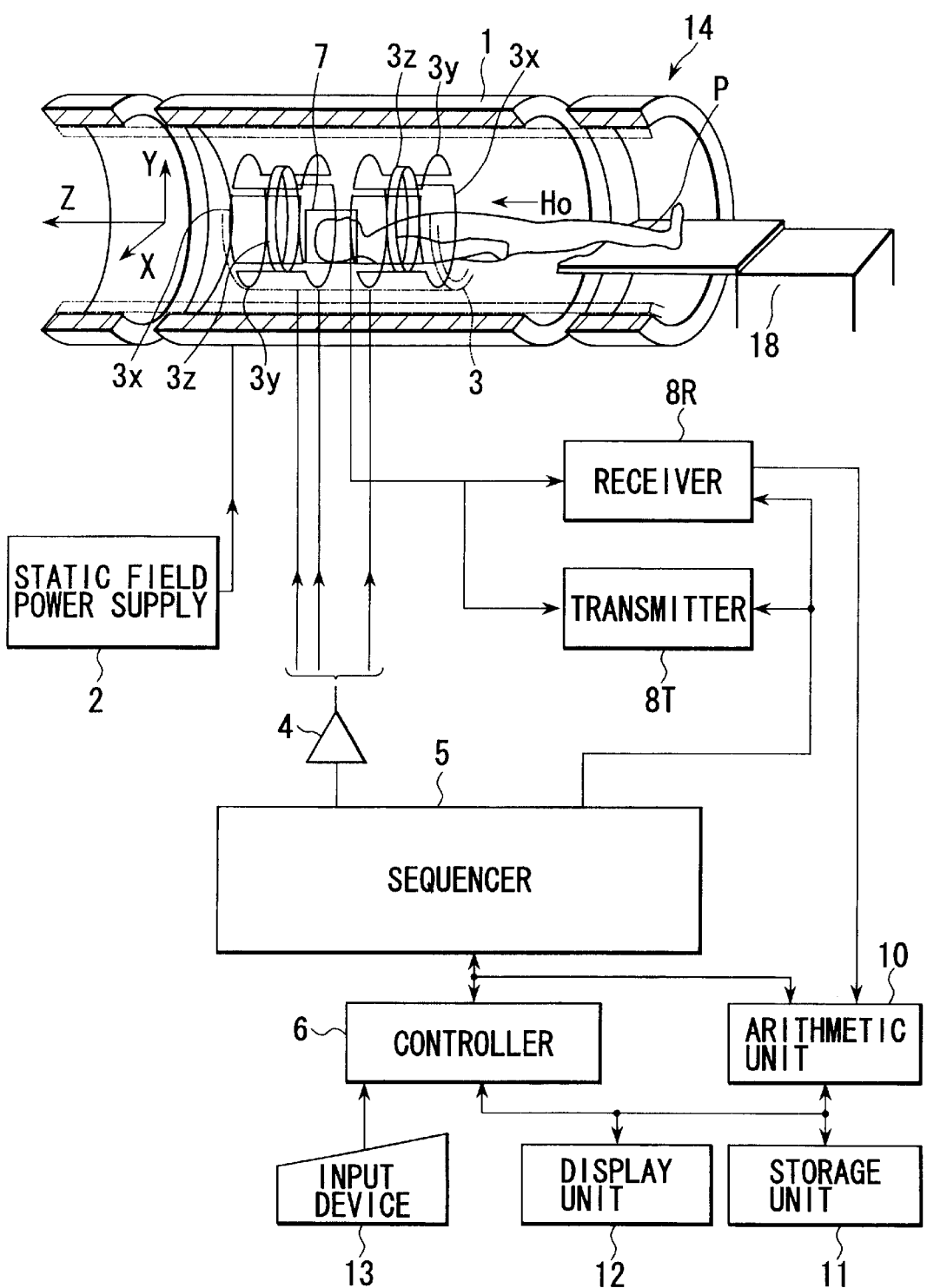
FIG. 16 is a view showing the basic arrangement of a magnetic resonance imaging apparatus according to the fourth embodiment.

The basic arrangement of a magnetic resonance imaging apparatus will be described first with reference to FIG. 16. The magnetic resonance imaging apparatus includes a gantry 14 having an measurement space in which an object subjected to image diagnosis is to be inserted/placed, a bed 18 disposed adjacent to the gantry 14, and a control processing section (computer system) for controlling the operations of the gantry 14 and bed 18 and processing MR signals. Typically, a substantially cylindrical measurement space extends through the inner central portion of the gantry 14. With regard to this cylindrical measurement space, the axial direction is defined as a Z direction, and an X direction (horizontal direction) and Y direction (vertical direction) perpendicular to the Z direction are defined.

The gantry 14 has a static field magnet 1 which receives a current supplied from a static field power supply 2 and generates a static field H0 in the measurement space. This static field magnet 1 is typically formed by a superconductive magnet. The static field magnet 1 has a substantially cylindrical shape as a whole. A gradient field coil 3 is placed in the bore of the static field magnet 1. The gradient field coil 3 is made up of three coils 3x, 3y, and 3z which independently receive currents supplied from a gradient field power supply 4 and generate X-, Y-, and z-axis gradient fields, respectively. The gradient field coil 3 is housed in a sealed vessel in which a vacuum or a similar state is maintained by a vacuum pump.

A high-frequency (RF coil) 7 is placed inside the gradient field coil 3. A transmitter 8T and receiver 8R are connected to the RF coil 7. The transmitter 8T supplies, to the RF coil 7, a current pulse that oscillates at a Larmor frequency to excite nuclear magnetic resonance (NMR) under the control of a sequencer 5. The receiver 8R receives an MR signal (high-frequency signal) via the RF coil 7, and performs various kinds of signal processes to form a corresponding digital signal.

The sequencer 5 is set under the control of a controller 6 for controlling the overall apparatus. An input device 13 is connected to the controller 6. The operator can select a desired pulse sequence from a plurality of kinds of pulse sequences in the spin echo method (SE) and echo-planar imaging method (EPI) through the input device 13. The controller 6 sets the selected pulse sequence in the sequencer 5. The sequencer 5 controls the application timings of gradient fields in the X-axis, Y-axis, and Z-axis directions, their strengths, the application timing of a high-frequency magnetic field, amplitude, duration, and the like in accordance with the set pulse sequence.

An arithmetic unit 10 inputs the MR signal (digital data) formed by the receiver 8R, and performs processes, e.g., arrangement of measured data in a two-dimensional Fourier space formed in the internal memory and Fourier transform for image reconstruction, to generate image data and spectrum data. A storage unit 11 stores computed image data. A display unit 12 displays an image.

An embodiment of the magnetic resonance imaging apparatus having the above basic arrangement will be described next.

Figure 17:
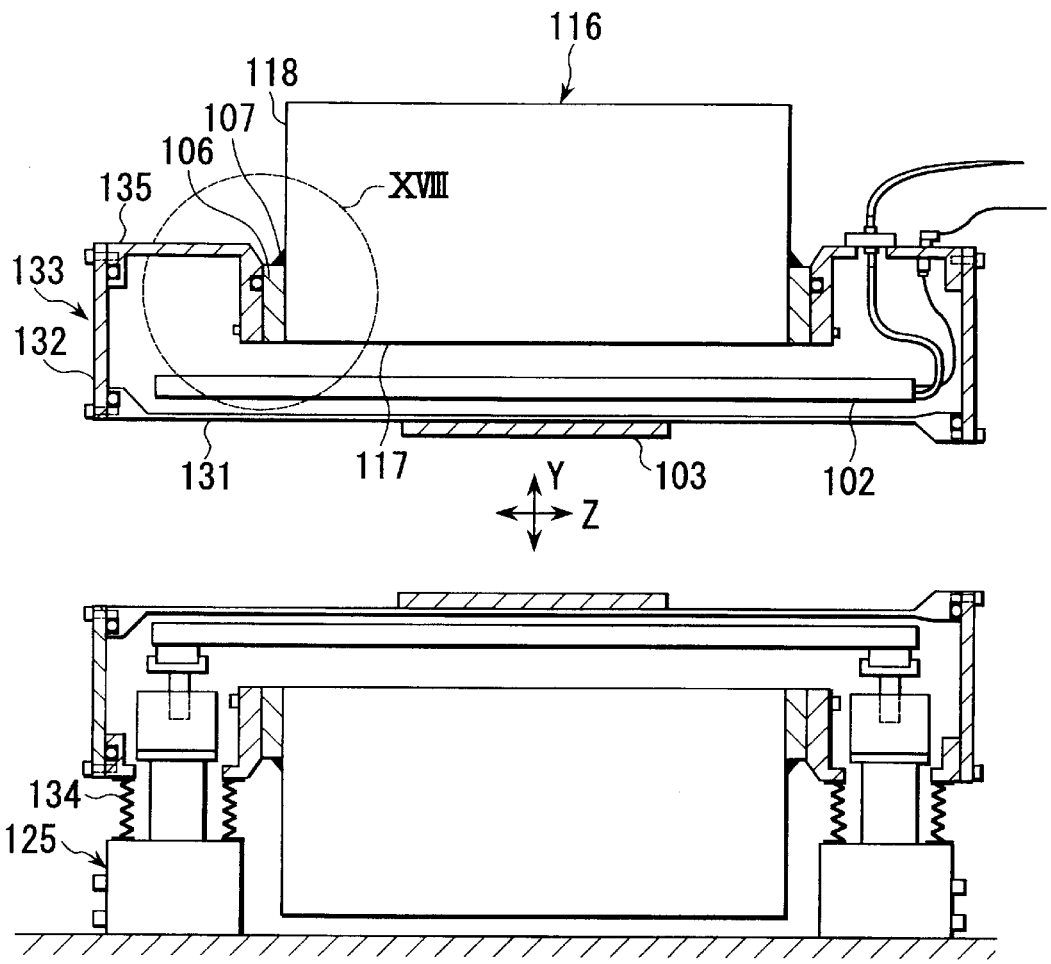
FIG. 17 is a longitudinal sectional view of a gantry according to the fourth embodiment.

FIG. 17 is a longitudinal sectional view of the gantry of the magnetic resonance imaging apparatus according to the fourth embodiment. A gradient field coil 102 may be of a non-shield type or active shield type. The gradient field coil 102 has x, y, and z coils as its windings. These x, y, and z coils are housed in a cylindrical bobbin.

The gradient field coil 102 having a substantially cylindrical shape is supported on a heavy, concrete gantry base 125 placed on the floor. The gradient field coil 102 is housed in a sealed vessel 133. The sealed vessel 133 has a liner 131 having a substantially cylindrical shape and forming the inner wall of the vessel, and a vacuum cover 132. The back surface of the sealed vessel 133 is closed with an inner wall 117 of a cryostat 116 for setting a static field magnet (superconductive coil in this case) in a cryogenic environment. A side wall 118 of the cryostat 116 is joined to the vacuum cover 132 with a joint plate 135. The sealed vessel 133 is coupled to the gantry base 125 via a vacuum bellows 134 to keep the sealed vessel 133 airtight.

The air in the sealed vessel 133 is exhausted by a vacuum pump to keep a vacuum or a similar state in the sealed vessel 133. This prevents air-born propagation of noise originating from the gradient field coil 102.

An RF coil 103 is placed on the inner surface of the liner 131. A high-frequency magnetic field is applied to an object via the RF coil 103, and an MR signal from the object is received.

In this arrangement, vacuum leakage tends to occur in the connection portion between the side wall 118 of the cryostat 116 and the joint plate 135. To prevent this vacuum leakage, an O-ring 108 for vacuum sealing is clamped between the side wall 118 of the cryostat 116 and the joint plate 135. However, the surface precision of the side wall 118 of the cryostat 116 is not very high. For this reason, the contact precision between the side wall 118 of the cryostat 116 and the O-ring 108 is not very high, and hence the sealing performance of the O-ring 108 is not sufficient.

Figure 18:
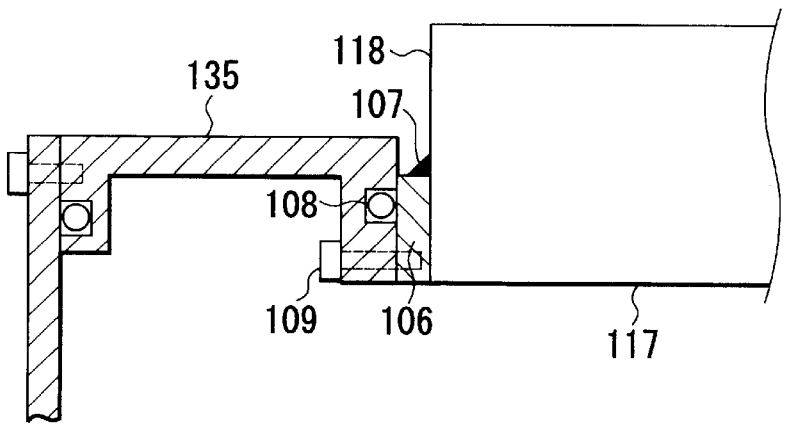
FIG. 18 is an enlarged view of the portion encircled by the dashed line in FIG. 17.

In contrast to this, according to this embodiment, as shown in FIG. 18, an annular flange 106 is welded (reference numeral 107) to the side wall 118 of the cryostat 116, and the joint plate 135 of the sealed vessel 133 is fixed to the flange 106 with a bolt 109 via the O-ring 108. The flange 106 can be formed with high precision by shaving or the like. Since the flange 106 can be brought into contact with the O-ring 108 properly, the sealing performance of the O-ring 108 can be maximized. In addition, since the side wall 118 of the cryostat 116 is connected to the flange 106 by welding, the connection portion therebetween can be kept airtight. This makes it possible to maintain a substantially vacuum state in the sealed vessel 133 and properly prevent air-born propagation of vibrations and noise.

Fifth Embodiment

FIG. 19A shows an outer appearance of the sealed vessel of a gradient field coil according to the fifth embodiment. To take a measure against noise, the gradient field coil is housed in a sealed vessel 201 held in a substantially vacuum state. In this arrangement, therefore, in the prior art, to check the position of the gradient field coil, the sealed vessel 201 must be partly disassembled.

In contrast to this, according to this embodiment, a pair of left and right circular holes are formed in each side wall 207 of the sealed vessel 201. Windows 202 made of a glass or fiber reinforced plastic material that transmits visible light are fitted in the holes. An operator can easily make a visual check on the position of the gradient field coil in the sealed vessel 201 from the outside via the windows 202.

As shown in FIG. 19B, a gradient field coil 204 has scale marks 206 each indicating the position of the coil. The scale mark 206 can be visually checked via the window 202. The operator can objectively grasp the position of the gradient field coil 204 relative to a static field magnet 205 while seeing the scale mark 206.

As shown in FIG. 19C, leg portions 203 of the sealed vessel 201 have bases 212. Supports 213 supporting the gradient field coil 204 are fitted in holes vertically formed in the bases 212 to be vertically movable. Threads are formed on the outer surfaces of the supports 213. Screws 215 are threadably engaged with the threads at crossing axes. When a dial 214 on the distal end portion of each screw 215 is rotated, the support 213 vertically moves, together with the gradient field coil 204, in the sealed vessel 201. This makes it possible to adjust the position of the gradient field coil 204 relative to the static field magnet 205.

In this manner, the gradient field coil can be visually checked from the outside without disassembling the vessel, and position adjustment can be performed. This can reduce the chances of degrading airtightness. Therefore, the vessel can be kept airtight, and a sound insulating effect for air-borne propagation of vibrations and noise can be enhanced.

Figure 19D:
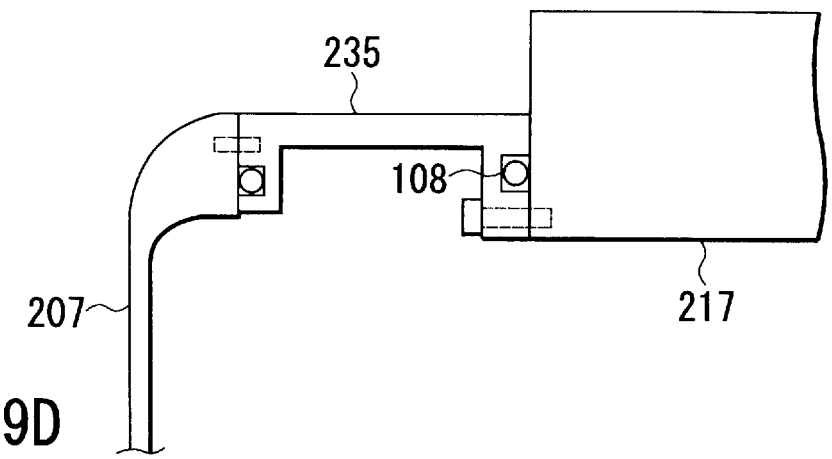
FIG. 19D is a partial sectional view of corners of the closed vessel according to the fifth embodiment.

Further, as shown in FIG. 19D, the side walls 207 of the sealed vessel 201 are jointed to the cryostat 217 with the joint plates 235. Corners where the joint plates 235 are jointed to the side walls 207 are rounded off. Corners where the joint plates 235 are jointed to the liner of the vessel 201 are rounded off. Therefore, the vessel 201 can have a sufficient strength to atmospheric pressure.

Sixth Embodiment

Figure 20:
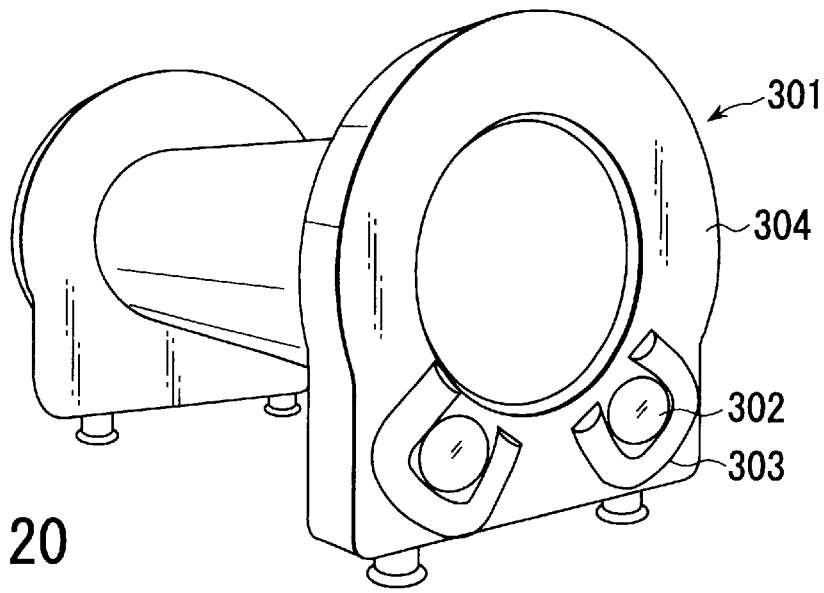
FIG. 20 is a perspective view of a sealed vessel according to the sixth embodiment.

FIG. 20 shows an outer appearance of the sealed vessel of a gradient field coil according to the sixth embodiment. The gradient field coil is housed in a sealed vessel 301. To prevent air-born propagation of noise originating from the gradient field coil 102, the air in the sealed vessel 301 is exhausted by a vacuum pump to keep a vacuum or a similar state in the sealed vessel 301. For this reason, the sealed vessel 133 receives an atmospheric pressure. The strength of the sealed vessel 133 is therefore important. In the fifth embodiment described above, the windows 302 are attached to the side walls 207 of the sealed vessel 201. In the sixth embodiment, to increase the strength of the portion of each window 302, a portion of a side wall 304 which surrounds the window 302 is formed into a convex portion 303 having a round shape like a half pipe, thereby reinforcing the portion around the window 302.

With this reinforcement, the degree of vacuum (internal pressure) in the sealed vessel 301 can be sufficiently increased, and hence a sound insulating effect for air-borne propagation of vibrations and noise can be enhanced.

Figure 21:
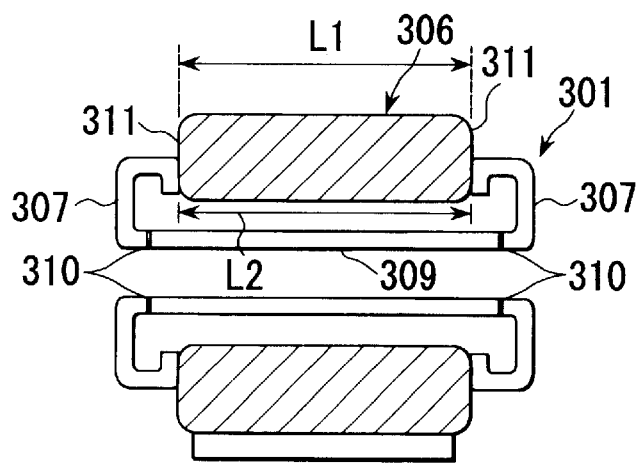
FIG. 21 is a cross-sectional view showing how the sealed vessel in FIG. 20 is joined to a static field magnet vessel.

As shown in FIG. 21, the sealed vessel 301 has a liner 309 having a substantially cylindrical shape and forming the inner wall of the vessel and a vacuum cover 307. The back surface of the sealed vessel 301 is closed with the inner wall of a cryostat 306 for setting a static field magnet (superconductive coil in this case) in a cryogenic environment. A side wall 311 of the cryostat 306 is joined to the vacuum cover 307.

In an actual manufacturing process, a length L1 of the cryostat 306 may not match with a length L2 of an opening portion of the sealed vessel 301 in which the cryostat 306 is to be fitted. In this case, the airtightness of the sealed vessel 301 deteriorates, and vacuum leakage occurs. To solve this problem, in this embodiment, an annular packing 310 is clamped between the liner 309 of the sealed vessel 301 and the vacuum cover 307. If, therefore, the length L1 of the cryostat 306 does not match with the length L2 of the opening portion of the sealed vessel 301 in which the cryostat 306 is to be fitted, the liner 309 of the sealed vessel 301 is joined to the vacuum cover 307 via the packing 310 having a proper width. This makes it possible to easily match the length L1 of the cryostat 306 with the length L2 of the opening portion of the sealed vessel 301 in which the cryostat 306 is to be fitted.

The packing 310 improves the joining precision between the sealed vessel 301 and the cryostat 306 to improve the airtightness of the sealed vessel 301. This enhances the sound insulating effect for air-borne propagation of vibrations and noise.

Seventh Embodiment

The gradient field coil is not only a source of vibrations and noise in a magnetic gantry. For example, a heat exchanger using a superconductive coil as a static field magnet produces such vibrations and noise. FIGS. 22 and 23 are sectional views of a heat exchanger according to this embodiment. A superconductive coil 401 is housed in a cryostat 404. The cryostat 404 is configured to surround a liquid nitrogen bath housing the superconductive coil 401 together with liquid nitrogen with a plurality of heat radiation shields 402, 405, and 406.

This cryostat 404 has a heat exchanger 407 for absorbing heat from the shield 402 and dissipating it outside. The heat exchanger 407 is comprised of a cylinder 408 having a bottom portion in contact with the shield 402, a cold head 411 which is cooled by helium gas He and is used to cover the cylinder 408, a displacer 409 which reciprocates like a piston between the bottom portion and the cold head 411 inside the cylinder 408 with the pressure of helium gas He, and a vacuum bellows 410.

When the displacer 409 is located on the bottom portion, the displacer 409 absorbs heat from the shield 402. When the displacer 409 is located at the top portion, the displacer 409 transfers heat to the cold head 411. By repeating this operation, heat can be dissipated from the shield 402.

As described above, since the displacer 409 reciprocates like a piston inside the cylinder 408, vibrations are produced. The vibrations mechanically propagate to the shields 402, 405, and 406. This produces noise.

To absorb the vibrations, a dynamic vibration absorber 414 is mounted on the cold head 411. An elastic member, e.g., a spring 412, of the dynamic vibration absorber 414 is connected onto the cold head 411 such that the expanding direction of the spring 412 is substantially parallel to the direction in which the displacer 409 reciprocates like a piston. A weight 413 is connected to the spring 412. As the displacer 409 reciprocates like a piston, the weight 413 moves vertically. With this operation, the vibrations of the cold head 411, originating from the displacer 409, are absorbed by the dynamic vibration absorber 414. As a consequence, noise is reduced.

The displacer 409 moves like a piston at the frequency of commercial power. The elasticity of the spring 412 and the mass of the weight 413 are set such that the dynamic vibration absorber 414 resonates with vibrations originating from the displacer 409 moving like a piston at this frequency. This makes it possible to effective absorb the vibrations.

Vibrations can also be reduced by the following arrangement. As shown in FIG. 24, two cylinders 408-1 and 408-2, two displacers 409-1 and 409-2, and two cold heads 411-1 and 411-2, i.e., two heat exchangers, are prepared, and the two heat exchangers are arranged such that the piston motion axes oppose each other, and the displacers 409-1 and 409-2 are made to move like a piston in opposite phases.

Eighth Embodiment

Figure 25:
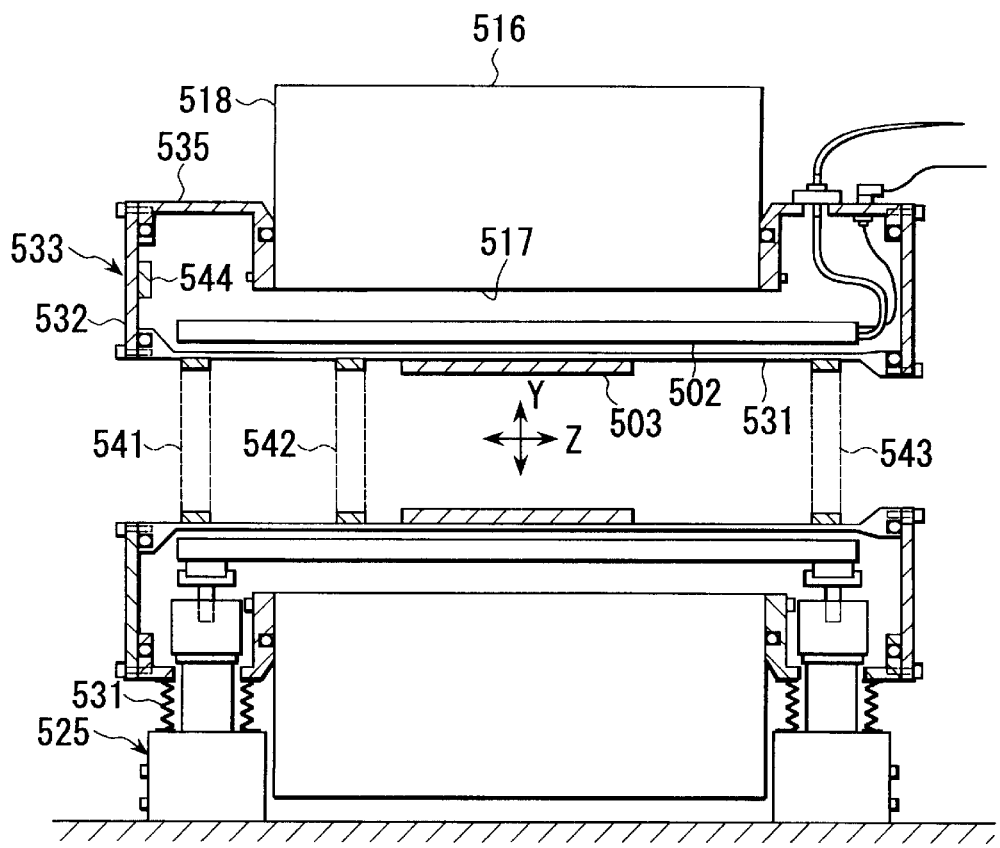
FIG. 25 is a longitudinal sectional view of a gantry according to the eighth embodiment.

FIG. 25 is a longitudinal sectional view of the gantry of a magnetic resonance imaging apparatus according to the eighth embodiment. A gradient field coil 502 includes x, y, and z coils as its windings. These x, y, and z coils are housed in a cylindrical bobbin. This substantially cylindrical gradient field coil 502 is supported on a heavy, concrete gantry base 525 installed on the floor. The gradient field coil 502 is housed in a sealed vessel 533. The sealed vessel 533 includes a liner 531 having a substantially cylindrical shape and forming the inner wall of the vessel and a vacuum cover 532. The back surface of the sealed vessel 533 is closed with an inner wall 517 of a cryostat 516 for setting a static field magnet (superconductive coil in this case) in a cryogenic environment. A side wall 518 of the cryostat 516 is joined to the vacuum cover 532 with a joint plate 535. The sealed vessel 533 is coupled to the gantry base 525 with a vacuum bellows 534 to keep the airtightness of the sealed vessel 533.

The vibrations of the gradient field coil 502 mechanically propagate to the sealed vessel 533. The frequency of the vibrations of the gradient field coil 502 is equal to the alternating frequency of a gradient field in a pulse sequence. Weights 541, 542, 543, and 544 are discretely mounted on the liner 531 and vacuum cover 532 such that the liner 531 and vacuum cover 532 of the sealed vessel 533 do not resonate with the vibrations of the gradient field coil 502, i.e., the natural frequencies of the liner 531 and vacuum cover 532 differ from the vibration frequency of the gradient field coil 502.

The weight 544 mounted on the vacuum cover 532 is, for example, a nonmagnetic metal piece. The annular gel-like substances 541, 542, and 543 are mounted along the inner wall of the liner 531. The substances 541, 542, and 543 are mounted outside an RF coil 503 to prevent a decrease in the Q value of the RF coil 503.

According to this structure, the liner 531 and vacuum cover 532 of the sealed vessel 533 do not resonate with the vibrations of the gradient field coil 502. Hence, noise is reduced.

Instead of or in addition to mounting the weights on the liner 531 and vacuum cover 532, the thicknesses of the liner 531 and vacuum cover 532 may be partly decreased. It is an important point of this embodiment that the masses of the liner 531 and vacuum cover 532 are partly increased/decreased to shift their natural frequencies. In addition to shifting the natural frequencies, beams or struts may be used to reinforce the structure.

Ninth Embodiment

Figure 26:
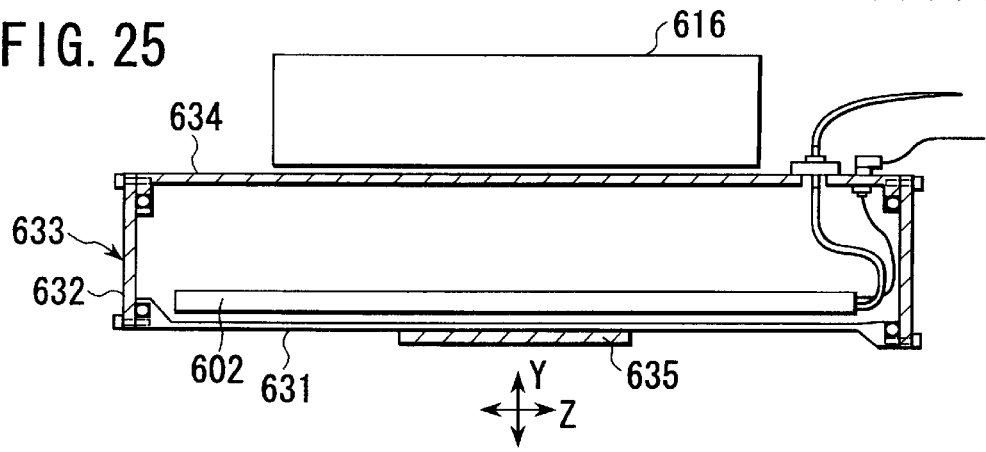
FIG. 26 is a longitudinal sectional view of a gradient field coil unit according to the ninth embodiment.
Figure 26:
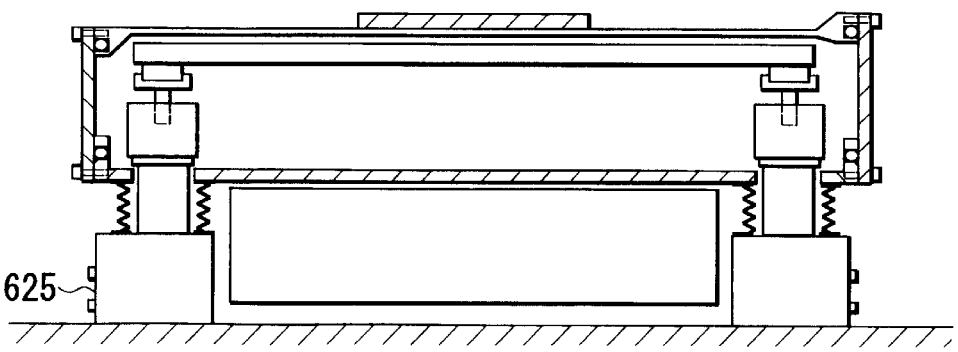

FIG. 26 is a longitudinal sectional view of the gantry of a magnetic resonance imaging apparatus according to the ninth embodiment. A gradient field coil 602 includes x, y, and z coils as its windings. These x, y, and z coils are housed in a cylindrical bobbin. This substantially cylindrical gradient field coil 602 is supported on a heavy, concrete gantry base 625 installed on the floor. The gradient field coil 602 is housed in a sealed vessel 633. The sealed vessel 633 includes a liner 631 having a substantially cylindrical shape, a vacuum cover 532 having a substantially annular, plate-like shape, and a back casing 634 having a substantially cylindrical shape. A cryostat 616 for setting a static field magnet (superconductive coil in this case) in a cryogenic environment is placed outside the back casing 634 of the sealed vessel 633. An RF coil 635 is mounted on the inner surface of the liner 631. A high-frequency magnetic field is applied to an object via the RF coil 635, and an MR signal is received from the object.

It is an important point of this embodiment that the sealed vessel 633 housing the gradient field coil 602 does not use the inner wall of the cryostat 616. In other words, the sealed vessel 633 and cryostat 616 are formed as completely discrete components. If the inner wall of the cryostat 616 is used for the sealed vessel 633 housing the gradient field coil 602, vacuum leakage tends to occur at the joint portion due to poor surface precision, dimensional errors, and the like of the cryostat 616. In this embodiment, however, the cryostat 616 is not joined to the sealed vessel 633. That is, the sealed vessel 633 is manufactured singly. Therefore, high airtightness can be attained regardless of poor surface precision, dimensional errors, and the like of the cryostat 616.

10th Embodiment

The 10th embodiment is configured to prevent type B waves and induced electrons from being produced when metal parts in the gantry rub against each other, and can be applied to fastening of all metal parts constituting the gantry of a magnetic resonance apparatus which physically vibrates or in which vibrations propagate.

The gantry is comprised of many metal parts, which are fastened to each other by mainly using metal screws. If, for example, as shown in FIG. 27A, when a copper tuner plate 724 is to be mounted on a metal gantry frame 724, a metal screw 723 and metal insert 722 are generally used in the prior art. Many capacitors are arranged in the gantry. When these capacitors are to be mounted on a tuner plate and the connector of an RF coil tuner is to be fastened to the tuner plate, many metal screws are used. As described above, in the gantry, when parts are to be fixed, metal screws are used at most portions. As shown in FIG. 27B, when these metal screws rub against the metal parts or metal parts rub against each other due to the above intense vibrations, so-called type B waves are produced. Such type B waves are picked up by the RF coil, and image artifacts may be produced. This has hardly posed a problem until recently. Recently, however, as higher voltages have been used to attain increases in the speed and strength of a gradient field, type B waves tend to increase in intensity. At present, image artifacts due to increased type B wave noise have become too large to be neglected. In addition to type B waves, electrons induced by contact between, for example, a connector and a tuner plate and vibrations directly enter a signal line to produce image artifacts, posing a problem.

It is an object of this embodiment to prevent the occurrence of type B waves and inducted electrons that cause noise.

As is known, a gantry is a magnetic apparatus mainly constituted by a static field magnet, gradient field coil, and RF coil, and includes many metal parts. These metal parts are mounted on many portions. These mounting portions can be roughly classified into two types. As shown in FIGS. 28 and 29, mounting portions of one type are portions where parts are physically fixed and must be electrically connected to each other, represented by a portion where copper plates constituting an RF coil are attached to each other, a portion where the RF coil copper plates 709 and 710 and a capacitor 711 are attached to each other, a portion where the RF coil copper plate 710 and a lead copper plate 703 are attached to each other, a portion where the lead copper plate 703 and an RF coil tuner copper plate 704 are attached to each other, a portion where the RF coil tuner copper plate 704 and a connector 706 are attached to each other, and a portion where the RF coil tuner copper plate 704 and a capacitor 715 are attached to each other. Mount portions of the other type are portions where it is a main object to physically fix parts to each other, but they need not be electrically connected to each other.

It is most preferable that parts be mounted on the former portions by using solder 705. In this case, since no parts rub against to each other, neither type B wave nor induced electrons are produced. However, solder cannot be used at some portions because of weak fastening force. Screws are used on such portions.

Figure 30:
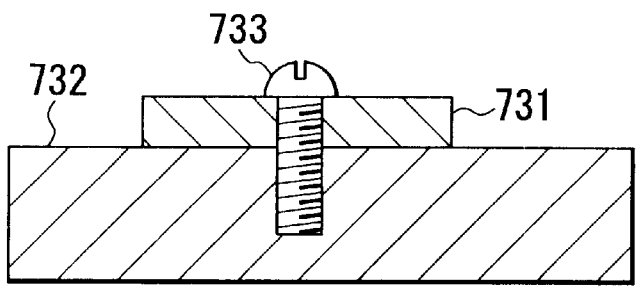
FIG. 30 is a view showing another example of how metal parts are connected to each other in the 10th embodiment.

FIG. 30 shows an example of how metal parts 731 and 732 are attached to each other by using a resin screw 733. In the prior art, since a metal screw is used, and the metal screw rubs against the metal parts 731 and 732, type B waves and induced electrons are inevitably produced. In this embodiment, however, the resin screw 733 is used, and hence generation of such waves and electrons can be prevented.

Figure 31:
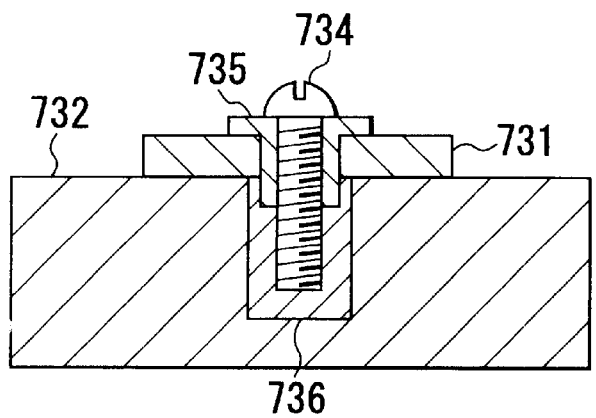
FIG. 31 is a view showing an example of how metal parts are insulated/connected from/to each other in the 10th embodiment.

FIG. 31 shows another example of how the metal parts 731 and 732 are attached to each other by using a metal screw 734. A substantially cylindrical resin spacer 735 is used to prevent direct contact between the metal screw 734 and metal part 731. In addition, a resin tap 736 is used to prevent contact between the metal screw 734 and the metal part 732. In this case, although the metal screw 734 is used, type B waves and induced electrons can be prevented by insulating the metal screw 734 from the metal parts 731 and 732 with the resin members 735 and 736.

Obviously, either of the methods shown in FIGS. 30 and 31 or a combination thereof can be used. It is expected that type B waves and inducted electrons will be suppressed by applying the mounting methods shown in FIGS. 30 and 31 to some portions in the gantry instead of all the corresponding portions.

Figure 32:
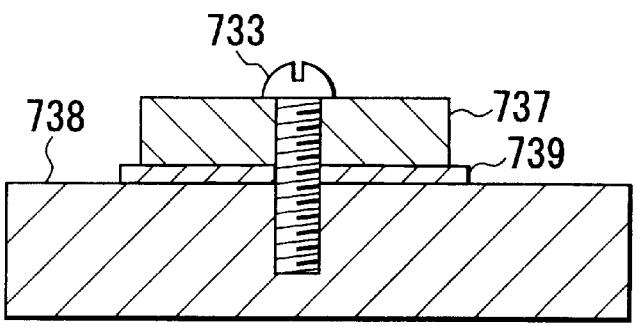
FIG. 32 is a view showing another example of how metal parts are insulated/connected from/to each other the 10th embodiment.

At the portions of the latter type, i.e., the portions where it is the main object to physically fix parts to each other, but there is no need to electrically connected them, metal parts 737 and 738 are attached to each other with the resin screw 733 as shown in, for example, FIG. 32. In this case, inserting an insulating sheet 739 between the metal parts 737 and 738 can prevent type B waves and inducted electrons generated due to friction between the metal parts 737 and 738 as well as type B waves and inducted electrons generated due to friction between the metal screw and the metal parts as in the prior art.

Figure 33:
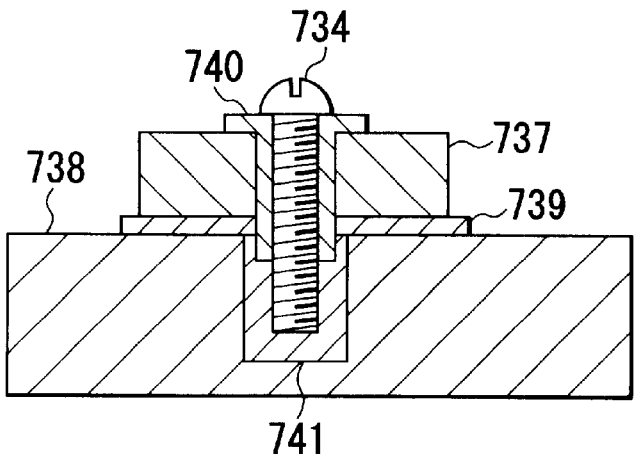
FIG. 33 is a view showing still another example of how metal parts are insulated/connected from/to each other the 10th embodiment.

FIG. 33 shows a case wherein the metal parts 737 and 738 are attached to each other by using the metal screw 734. A substantially cylindrical resin spacer 740 is used to prevent contact between the metal screw 734 and the metal part 738. In addition, a resin tap 741 is used to prevent contact between the metal screw 734 and the metal part 738. In this case, although the metal screw 734 is used, the type B waves and inducted electrons can be prevented by insulating the metal screw 734 from the metal parts 737 and 738 with the resin members 740 and 741.

Obviously, either of the methods shown in FIGS. 32 and 33 or a combination thereof can be used. It is expected that the type B waves and inducted electrons will be suppressed by applying the mounting methods shown in FIGS. 32 and 33 to some portions in the gantry instead of all the corresponding portions.

In addition, the type B waves and inducted electrons generated due to friction between metal screws and metal parts as in the prior art can be prevented by applying the mounting method shown in FIG. 32 or 33 to portions where metal parts are attached to resin parts such as a coil bobbin as well as portions where metal parts are attached to each other.

11th Embodiment

The 11th embodiment is related to an improvement in an RF shield placed around an RF coil. The RF shield is typically formed by a copper cylinder to magnetically isolate the RF coil from the outside and shield the RF coil against external electromagnetic noise. An eddy current is produced in this copper cylinder due to high-speed switching of a gradient field, distorting the gradient field. To decrease the time constant of this eddy current, many slits are formed in the copper cylinder.

In addition, capacitors are connected between copper plates across the slits to transmit a magnetic field having a relatively low frequency (up to about 100 kHz), e.g., a gradient field, and block a magnetic field having a high frequency of several MHz to several ten MHz, e.g., excitation pulses, i.e., increase a low-frequency impedance and decrease a high-frequency impedance. As another conventional RF shield, an RF shield having capacitances formed on its upper and lower surfaces is also available, which is formed by sticking a plurality of copper plates on the upper and lower surfaces of a dielectric substrate with gaps (slits).

A high-speed imaging method such as echo planar imaging (EPI) is required to image, for example, the heart. A very high response speed of a gradient field is indispensable for this operation. For this reason, many slits must be formed in very small increments (at very small intervals). If, however, many slits are formed, the capacitance decreases with a reduction in the area of each copper plate. This makes high-frequency short circuits in the respective slits imperfect. As a consequence, the shield function is made imperfect.

This embodiment is configured to achieve both an increase in the number of slits and prevention of a decrease in capacitance.

Figure 34:
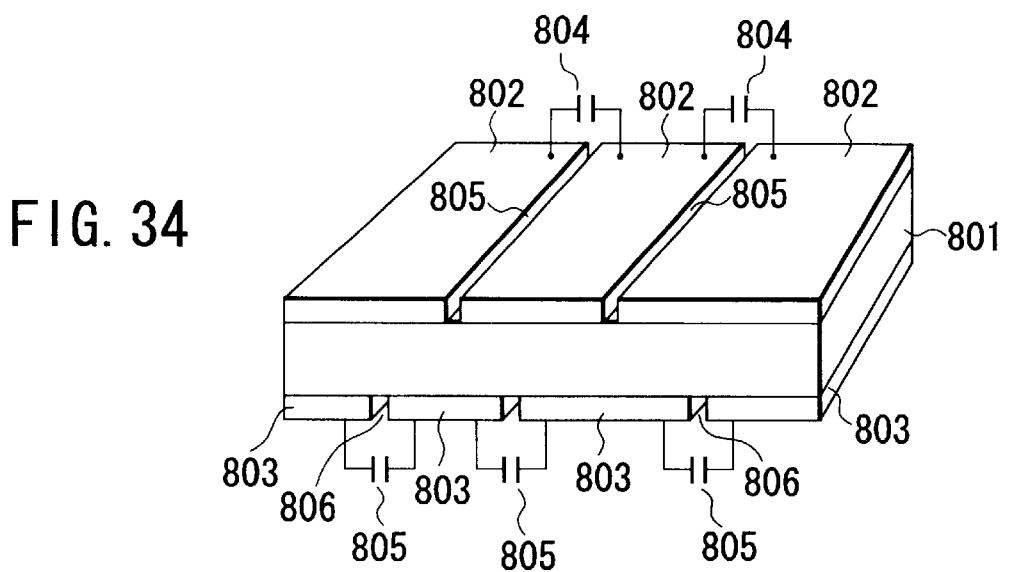
FIG. 34 is a perspective view of an RF shield according to the 11th embodiment.

FIG. 34 is a partial perspective view of an RF shield according to this embodiment. A plurality of copper plates 802 are stuck on the upper surface of a dielectric substrate 801 with predetermined gaps (slits) 805. Likewise, a plurality of copper plates 803 are formed on the lower surface of the dielectric substrate 801 with predetermined gaps (slits) 806. A capacitance is formed between the copper plates 802 and 803 opposing through the dielectric substrate 801.

In addition, capacitors 804 are formed between the adjacent copper plates 802 on the upper surface of the dielectric substrate 801. Likewise, capacitors 805 are formed between the adjacent copper plates 803 on the lower surface of the dielectric substrate 801.

In this arrangement, the total capacitance of the capacitors 804 on the upper surface, the capacitors 805 on the lower surface, and the capacitance between the copper plates 802 on the upper surface and the copper plates 803 on the lower surface is ensured as a capacitance large enough to make high-frequency short circuits perfect.

12th Embodiment

Figure 35:
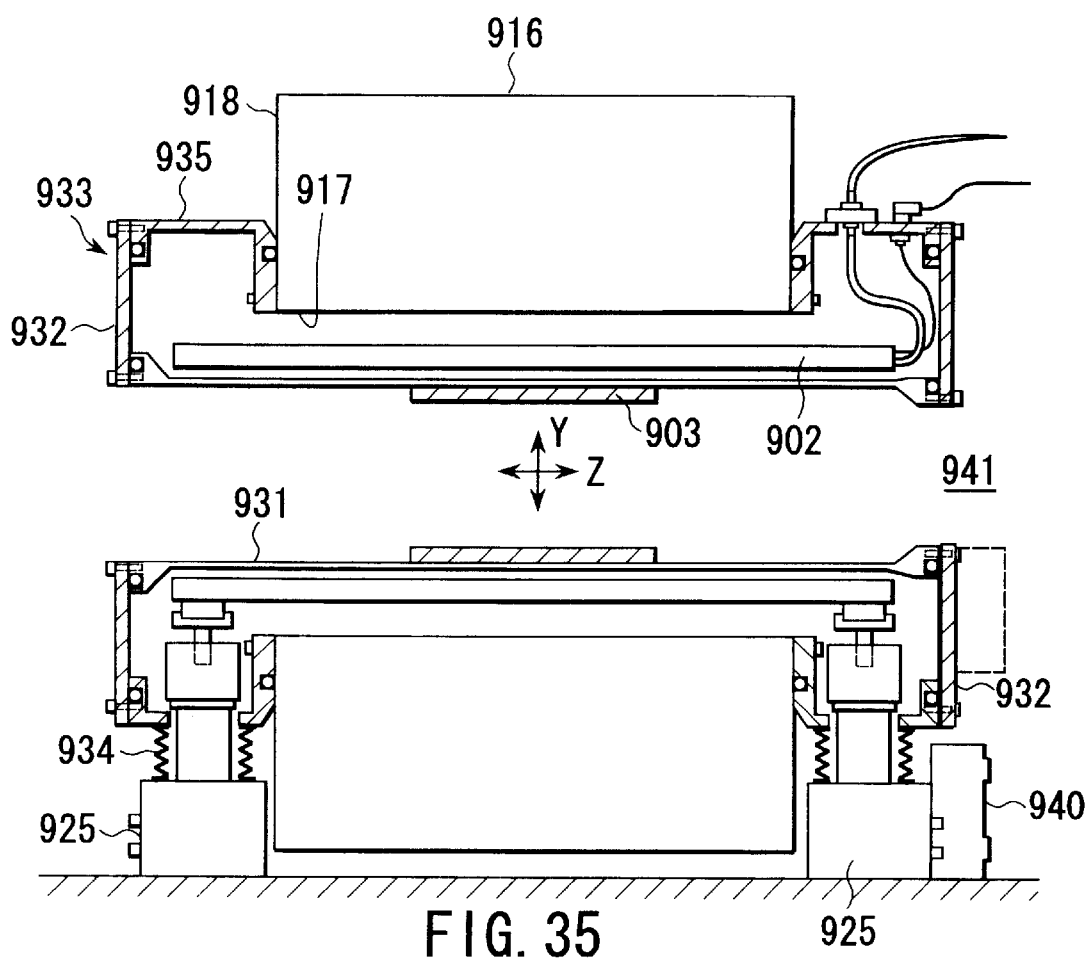
FIG. 35 is a longitudinal sectional view of the gantry of a magnetic resonance imaging apparatus according to the 12th embodiment.

FIG. 35 is a longitudinal sectional view of the gantry of a magnetic resonance imaging apparatus according to the 12th embodiment. A gradient field coil 902 includes x, y, and z coils as its windings. These x, y, and z coils are housed in a cylindrical bobbin. This substantially cylindrical gradient field coil 902 is supported on a heavy, concrete gantry base 925 installed on the floor. The gradient field coil 902 is housed in a sealed vessel 933. The sealed vessel 933 includes a liner 931 having a substantially cylindrical shape and forming the inner wall of the vessel and a vacuum cover 932. The back surface of the sealed vessel 933 is closed with an inner wall 917 of a cryostat 916 for setting a static field magnet (superconductive coil in this case) in a cryogenic environment. A side wall 918 of the cryostat 916 is joined to the vacuum cover 932 with a joint plate 935. The sealed vessel 933 is joined to the gantry base 925 with a vacuum bellows 934 to keep the sealed vessel 933 airtight.

An RF coil 903 is placed on the inner surface of the liner 931. A transmitter and receiver are connected to the RF coil 903. The transmitter supplies a high-frequency current pulse corresponding to a Larmor frequency to the RF coil 903 to excite nuclear magnetization in the object with a high-frequency magnetic field. The transmitter is typically comprised of an oscillating section, phase selecting section, frequency converting section, amplitude modulating section, and high-frequency power amplifying section. The receiver is comprised of a preamplifying section, intermediate frequency converting section, phase detecting section, low-frequency amplifying section, low-pass filter, and A/D converter to receive an MR signal from the object via the RF coil 903.

The transmitter and receiver are housed in an RF unit 940. The RF unit 940 is installed in a place near the RF coil 903 to achieve reduction in power loss and noise by shortening the cable required. In the prior art, as indicated by the dotted line in FIG. 20, the RF unit is mounted on the vacuum cover 932 near an edge portion of an opening portion 941. In this place, however, the leakage magnetic field from the gradient field coil 902 exhibits the highest strength. The RF unit 940 includes many conductive parts, and eddy currents are produced in these conductive parts due to the leakage magnetic field from the gradient field coil 902. As a consequence, the conductive parts vibrate due to the Lorents force. The vibrations propagate to the sealed vessel 933 to cause noise.

It is an object of this embodiment to reduce noise originating from the RF unit 940.

The RF unit 940 is not mounted on the vacuum cover 932 near the edge portion of the opening portion 941 but is installed in a place physically spaced apart from the sealed vessel 933, i.e., a place located outside the RF coil 903 at a position near a position directly below the opening portion 941 in the radial direction of the cylindrical gantry with reference to the central axis (Z-axis). More specifically, the RF unit 940 is installed on the heavy, concrete gantry base 925 or another dedicated base.

In this installation place, the RF unit 940 is affected less by the leakage magnetic field from the RF coil 903 than in the conventional installation place. For this reason, the vibrations of the conductive parts in the RF unit 940 are reduced. In addition, since the RF coil 903 is physically spaced apart from the sealed vessel 933 and is mounted on the heavy, concrete gantry base 925, fine vibrations of the RF coil 903 hardly propagate to the sealed vessel 933.

Noise originating from the RF unit 940 can therefore be reduced.

13th Embodiment

As described above, the gradient field is housed in the sealed vessel which is evacuated by the vacuum pump to prevent noise. As the degree of vacuum (pressure) in a sealed vessel increases (decreases), the noise insulating effect increases. To increase the degree of vacuum in the sealed vessel, the vacuum pump is continuously operated during scanning operation in the prior art. This continuous operation shortens the service life of the vacuum pump. If the vacuum pump with decreased capability is used, the degree of vacuum in the sealed vessel cannot be increased, resulting in a deterioration in noise insulating effect.

This embodiment is configured to keep a noise insulating effect as long as possible by reducing the load on the vacuum pump.

Figure 36:
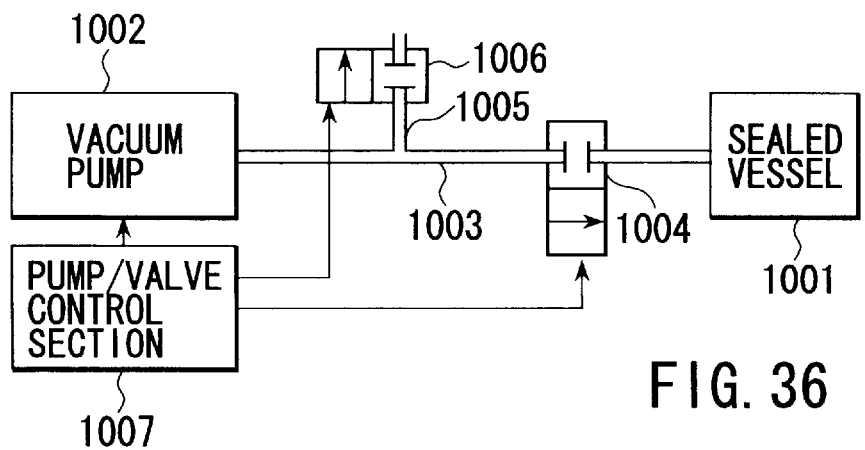
FIG. 36 is a system diagram of a vacuum pump for a sealed vessel according to the 13th embodiment.

FIG. 36 shows a vacuum pump and piping system according to this embodiment. A sealed vessel 1001 is connected to a vacuum pump 1002 via a main tube 1003. A solenoid valve 1004 is placed midway along the main tube 1003. A branch tube 1005 is coupled to the main tube 1003. The distal end of the branch tube 1005 is open to the atmosphere via a solenoid valve 1006.

Figure 37:
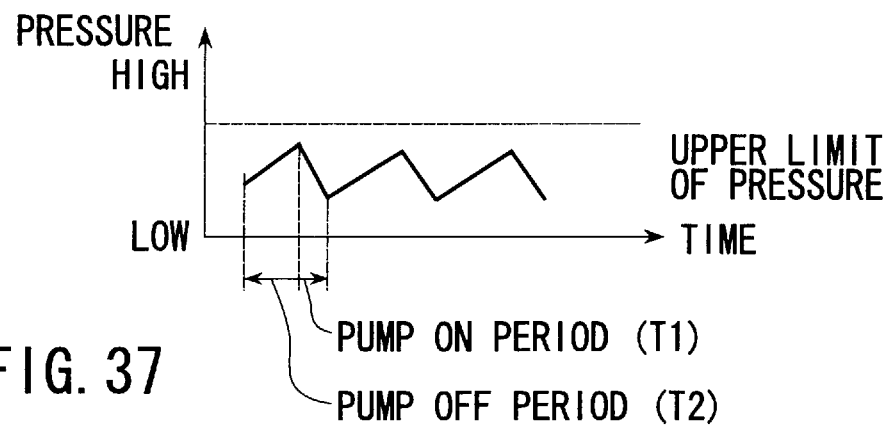
FIG. 37 is a graph showing changes in pressure in the sealed vessel in the 13th embodiment.

The vacuum pump 1002 is driven and the solenoid valves 1004 and 1006 are opened/closed under the control of a pump/valve control section 1020. The vacuum pump 1002 is alternately driven (ON) and stopped (OFF) under the control of the pump/valve control section 1020, as shown in FIG. 37. The duration of an ON period T1 and the duration of an OFF period T2 are set in advance such that the pressure in the sealed vessel 1001 does not exceed a predetermined upper limit. The duration of the ON period T1 and the duration of the OFF period T2 can be arbitrarily adjusted.

Intermittently driving the vacuum pump 1002 in this manner, instead of continuously driving it, can reduce the frequency of maintenance for oil, an oil filter, and the like as compared with a case wherein the vacuum pump 1002 is continuously driven.

Figure 38:
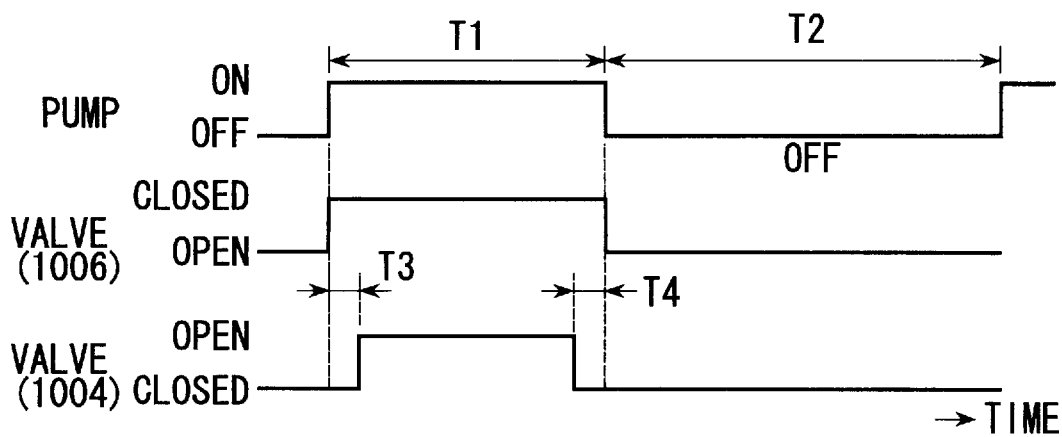
FIG. 38 is a timing chart of ON/OFF operation of the vacuum pump and the opening/closing of valves.

As shown in FIG. 38, the opening/closing of the solenoid valves 1004 and 1006 is interlocked with the intermittent driving of the vacuum pump 1002 by the pump/valve control section 1020.

First of all, the solenoid valve 1006 of the branch tube 1005 is opened/closed in synchronism with the intermittent driving of the vacuum pump 1002. That is, the solenoid valve 1006 is closed in synchronism with switching of the vacuum pump 1002 from the OFF state to the ON state, and vice versa.

To reduce the load on the vacuum pump 1002, the solenoid valve 1004 of the main tube 1003 is opened with a delay of a time T3 with respect to the switching timing of the vacuum pump 1002 at which it is switched from the OFF state to the ON state, and is closed a time T4 earlier than the switching timing of the vacuum pump 1002 at which it is switched from the ON state to the OFF state. These time differences T3 and T4 are set to arbitrary times from several sec to several min.

Since the solenoid valve 1004 is opened with the delay of the time T3 from the OFF-to-ON switching timing of the vacuum pump 1002, lubrication in the vacuum pump 1002 can be completed in a relatively short period of time (pre-vacuum period), i.e., the time T3, after the vacuum pump 1002 is started. This is because the object to be evacuated is a small-volume portion extending from the inlet of the pump to the solenoid valve 1004. When the time T3 has elapsed after the start of the pump, the solenoid valve 1004 of the main tube 1003 is opened to start evacuating operation (main vacuum) for a target having a large total volume of the volume of the portion extending from the solenoid valve 1004 to the sealed vessel 1001 and the volume of the sealed vessel 1001. At this time, lubrication in the vacuum pump 1002 has already been completed, and hence the operation can smoothly shift to the main vacuum operation. The load on the vacuum pump 1002 can therefore be reduced.

When a predetermined time (T1 to T4) has elapsed after the vacuum pump 1002 is started, i.e., at a timing the time T4 earlier than the timing at which the vacuum pump 1002 is turned off, the solenoid valve 1004 of the main tube 1003 is closed. This indicates that the sealed vessel 1001 is isolated from the vacuum pump 1002 when the pressure in the sealed vessel 1001 sufficiently decreases. This makes it possible to prevent an abrupt increase in the pressure in the sealed vessel 1001 upon stopping of the vacuum pump 1002.

14th Embodiment

FIG. 39 shows the arrangement of the main part of a magnetic resonance imaging apparatus according to the 14th embodiment. A gantry 1101 incorporates a static field magnet 1102 for generating a static field H0, a gradient field coil 1103 for receiving a current from a gradient field power supply (G-amp) 1105, an RF coil 1104, and a plurality of shim coils 1116 which receive currents from a shim coil power supply (Shim-amp) 1107 and generate magnetic fields for correcting static field inhomogeneity.

To achieve noise insulation, the gradient field coil 1103 is housed in a sealed vessel 1115 in which a vacuum or similar state is maintained by a vacuum pump 1111. A plurality of vacuum sensors (vacuum gages) 1112 are discretely arranged in the sealed vessel 1115 to measure an internal pressure. The data representing the degree of vacuum measured by the vacuum sensor 1112 is stored in a storage section 1113. Driving state data from the vacuum pump 1111 is stored in the storage section 1113, together with this degree-of-vacuum data. The driving state data indicates the driving time of the vacuum pump 1111.

A maintenance information generating section 1114 generates maintenance information of the sealed vessel 1115 and vacuum pump 1111 on the basis of the degree-of-vacuum data and driving state data stored in the storage section 1113, as needed. The maintenance information generating section 1114 generates maintenance information that prompts maintenance of the vacuum pump 1111 and sealed vessel 1115 when it is determined from the degree-of-vacuum data that the degree of vacuum (pressure) in the sealed vessel 1115 does not decrease below a predetermined pressure corresponding to, for example, a noise level of 99 dB in the imaging area. The maintenance information generating section 1114 also generates maintenance information that prompts maintenance of the vacuum pump 1111 when the cumulative driving time calculated from the driving state data exceeds a predetermined value. Each maintenance information is, for example, a message that prompts maintenance of the sealed vessel 1115 or vacuum pump 1111, and is displayed on a display 1110.

A receiver 1108 acquires an MR signal (high-frequency signal) via the RF coil 1104, performs pre-processes such as detection and A/D conversion for the signal, and outputs the resultant signal to a processor 1109. The processor 1109 processes the acquired MR data to generate an image and spectrum. The image and spectrum are sent to the display 1110 to be displayed.

The processor 1109 has the function of correcting the phase of the MR data acquired by the receiver 1108 and performing frequency shift on the basis of degree-of-vacuum data as well as the main function of generating images and spectra. As the degree of vacuum varies, the strength H0 of the static field varies. As the strength H0 of the static field varies, for example, a resonance frequency f0 of a proton varies in the static field on which no gradient field is superimposed. The processor 1109 holds data representing the relationship between the degree of vacuum measured in advance and the resonance frequency f0, and specifies the resonance frequency (corrected resonance frequency) f0 corresponding to the degree-of-vacuum data by referring to the relationship data. In MRS (MR spectroscopy), the phase of the MR data acquired by the receiver 1108 is corrected and frequency shift is performed on the basis of this corrected resonance frequency f0. The processor 1109 then generates a spectrum on the basis of this corrected data. In practice, data is repeatedly acquired, and phase correction and frequency shift are performed for each data to generates a plurality of spectra. These spectra are then added together. In EPI (Echo Planar Imaging), an EPI image is generated on the basis of acquired data, and the EPI image is shifted in the phase encoding direction (the shifting of the EPI image largely generates in the phase-encoding direction, and generates in the read-out direction in a small). In practice, data is repeatedly acquired, and an EPI image is generated for each data. Each image is then shifted in the phase encoding direction, and the resultant EPI images are added/subtracted. In the case of a phase image as well, a phase shift amount is calculated on the basis of the corrected resonance frequency f0, and the phase image is corrected on the basis of the phase shift amount.

As described above, according to this embodiment, maintenance information can be generated, as needed. In addition, phase and frequency correction can be made in accordance with variations in degree of vacuum.

15th Embodiment

FIG. 40 shows the arrangement of the main part of a magnetic resonance imaging apparatus according to the 15th embodiment. A gantry 1201 incorporates a static field magnet 1202 for generating a static field H0, a gradient field coil 1203 for receiving a current from a gradient field power supply (G-amp) 1205, an RF coil 1204 connected to a transmitter/receiver (RF-amp) 1208, and a plurality of shim coils 1216 which receive currents from a shim coil power supply (Shim-amp) 1207 and generate magnetic fields for correcting static field inhomogeneity.

To achieve noise insulation, the gradient field coil 1203 is housed in a sealed vessel 1215 in which a vacuum or similar state is maintained by a vacuum pump 1211. A plurality of vacuum sensors (vacuum gages) 1212 are discretely arranged in the sealed vessel 1215 to measure an internal pressure. On the basis of the degree-of-vacuum data measured by the vacuum sensor 1212, a real-time manager 1210 outputs an instruction, e.g., an instruction to wait for the execution of a pulse sequence to a sequence controller 1209 for controlling the gradient field power supply 1205, transmitter/receiver 1208, and shim coil power supply 1207 in accordance with the pulse sequence. The real-time manager 1210 also controls the operation of the vacuum pump 1211 on the basis of the measured degree-of-vacuum data. Note that a system manager 1213 is used to control the overall system in accordance with an instruction input by an operator through a console 1214.

Real-time control of the real-time manager 1210 will be described first. The real-time manager 1210 executes the following functions.

(1) The vacuum pump 1211 is started before scanning operation. The real-time manager 1210 does not output a scan start command to the sequence controller 1209 until the degree of vacuum in the sealed vessel 1215 (pressure in the sealed vessel) decreases below a predetermined value. That is, the real-time manager 1210 outputs a scan start command to the sequence controller 1209 only when the degree of vacuum exceeds the predetermined value.

(2) In executing a pulse sequence sensitive to magnetic field variations, e.g., MRS or EPI, the real-time manager 1210 continuously drives the vacuum pump 1211 during scanning operation.

(3) When the degree of vacuum exceeds the predetermined value during scanning operation, the real-time manager 1210 outputs a command to stop the scanning operation to the sequence controller 1209.

(4) When the degree of vacuum decreases below the predetermined value, the real-time manager 1210 drives the vacuum pump 1211 before scanning operation, and does not output a scan start command to the sequence controller 1209 until the degree of vacuum reaches a predetermined value.

(5) The real-time manager 1210 selectively uses a driving pattern for the vacuum pump 1211 in accordance with imaging conditions (e.g., the type of pulse sequence, an average number, and dynamic imaging). In executing, for example, a pulse sequence in the spin echo method or the like, which is not very sensitive to magnetic field variations, the real-time manager 1210 intermittently drives the vacuum pump 1211, as shown in FIG. 41A. For example, the real-time manager 1210 drives the vacuum pump 1211 for a period ΔT1, and stops it for a period Δt1. The vacuum pump 1211 is alternately driven/stopped repeatedly in this manner. In executing a pulse sequence which is relatively sensitive to magnetic field variations, the real-time manager 1210 sets a driving period ΔT2 and stop period Δt2 of the pump 1211 to be shorter than ΔT1 and Δt1, thus reducing the width of magnetic field variations. In executing a pulse sequence which is very sensitive to magnetic field variations, e.g., MRS or EPI, the real-time manager 1210 continuously drives the vacuum pump 1211 as shown in FIG. 14C in the same manner as in (2). In addition, in executing a pulse sequence which is very sensitive to magnetic field variations, e.g., MRS or EPI, the real-time manager 1210 may stop the pump 1211 and set the atmospheric pressure in the sealed vessel instead of continuously driving the pump 1211. In this case, although a noise reducing effect cannot be expected, at least magnetic field variations can be eliminated. To properly reconstruct images even at the atmospheric pressure, the real-time manager 1210 holds image quality parameter (magnetic field inhomogeneity, center frequency, and phase shift) information corresponding to the atmospheric pressure in advance, and the transmitter/receiver 1208 adjusts the shim coil current, the center frequency and phase of a high-frequency current pulse in the transmitter/receiver 1208, and the reference frequency and phase of a reception system in accordance with these parameters.

(6) The real-time manager 1210 drives/stops the pump 1211 in accordance with the comparison result between the measured degree of vacuum and the predetermined value. More specifically, when the measured degree of vacuum exceeds an upper limit, the real-time manager 1210 drives the pump 1211. When the measured degree of vacuum is below a lower limit, the real-time manager 1210 stops the pump 1211. This makes it possible to suppress variations in degree of vacuum between the upper limit value and the lower limit value. The upper and lower limit values can be changed in accordance with imaging conditions as in the case of (5).

(7) If the degree of vacuum does not decrease below the predetermined value even after the pump 1211 is continuously driven, a warning is generated by sound or image display.

The real-time manager 1210 also has the function of performing the following corrections in accordance with the degree of vacuum. (1) Magnetic field inhomogeneity changes depending on the degree of vacuum. The relationship between the degree of vacuum and magnetic field inhomogeneity is measured and held in the real-time manager 1210 in advance. The real-time manager 1210 specifies magnetic field inhomogeneity in accordance with the degree of vacuum by referring to this relationship, and adjusts the shim coil current to be supplied to the shim coil power supply 1207 in accordance with the specified magnetic field inhomogeneity. This makes it possible to quickly correct magnetic field inhomogeneity. In practice, the relationship between the degree of vacuum and magnetic field inhomogeneity is discretely measured, and magnetic field inhomogeneity can be obtained by linear interpolation from the discrete value. (2) As the degree of vacuum varies, the strength of the static field varies. As a result, a resonance frequency B0 of a proton varies in the static field on which no gradient field is superimposed. The real-time manager 1210 adjusts the center frequency and phase of a high-frequency current pulse in the transmission system of the transmitter/receiver 1208 in accordance with the resonance frequency B0 corresponding to this degree of vacuum. In addition, the real-time manager 1210 adjusts the reference frequency and phase of the reception system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus which generates an MR signal from an object by applying a gradient field pulse generated by a gradient field coil and a high-frequency magnetic field pulse generated by a high-frequency coil to the object in a measurement space in which a static field is formed, and reconstructs an image on the basis of the MR signal, comprising:
   a sealed vessel housing the gradient field coil;
   a pump for exhausting internal air from said sealed vessel; and
   a noise gage for detecting a noise level in the measurement space, wherein said noise gage is used for speech communication.

2. A magnetic resonance imaging apparatus which generates an MR signal from an object by applying a gradient field pulse generated by a gradient field coil and a high-frequency magnetic field pulse generated by a high-frequency coil to the object in a static field, and reconstructs an image on the basis of the MR signal, comprising:
   a sealed vessel housing the gradient field coil;
   a pump for exhausting internal air from said sealed vessel;
   a control circuit for controlling operation of said pump;
   a vibration meter for detecting vibrations due to driving of said gradient field coil; and
   a circuit for stopping driving said gradient field coil when a vibration level detected by said vibration meter is not less than a predetermined value.

3. A magnetic resonance imaging apparatus which generates an MR signal from an object by applying a gradient field pulse generated by a gradient field coil and a high-frequency magnetic field pulse generated by a high-frequency coil to the object in a static field, and reconstructs an image on the basis of the MR signal, comprising:
   a sealed vessel housing the gradient field coil;
   a pump for exhausting internal air from said sealed vessel;
   a gradient field power supply for supplying a current to said gradient field coil; and
   a control circuit for controlling said gradient field power supply to change a gradient of a leading edge of the current or a rise time of the current, wherein said control circuit determines the gradient of the leading edge or the rise time on the basis of a designated allowable noise level.

4. A magnetic resonance imaging apparatus including a static field magnet, a gradient field coil, a high-frequency coil, and a sealed vessel housing the gradient field coil, comprising:
   a pump for exhausting internal air from said sealed vessel;
   a vacuum meter for detecting a degree of vacuum in said sealed vessel; and
   a correcting section for correcting data acquired through the high-frequency coil or an image generated from the data on the basis of the detected degree of vacuum.

5. An apparatus according to claim 4, wherein said correcting section estimates a resonance frequency shift on the basis of the detected degree of vacuum, performs phase correction and/or frequency shift for a plurality of spectra generated from data acquired through the high-frequency coil, and adds the spectra.

6. An apparatus according to claim 4, wherein said correcting section estimates a resonance frequency shift on the basis of the detected degree of vacuum, shifts each of a plurality of images generated from data acquired through the high-frequency coil in a phase encoding direction, and adds or subtracts the plurality of images.

7. An apparatus according to claim 4, wherein said correcting section estimates a resonance frequency shift on the basis of the detected degree of vacuum, and phase-shifts each of a plurality of phase images generated from data acquired through the high-frequency coil.

8. A magnetic resonance imaging apparatus including a static field magnet, a gradient field coil, a high-frequency coil, and a sealed vessel housing the gradient field coil, comprising:
   a pump for exhausting internal air from said sealed vessel;
   means for driving the gradient field coil and high-frequency coil to generate an MR signal from an object in accordance with an arbitrarily set imaging condition and acquire the MR signal; and
   a pump control section for changing a driving pattern of said pump in accordance with the imaging condition.

9. A magnetic resonance imaging apparatus including a static field magnet, a gradient field coil, a high-frequency coil, and a sealed vessel housing the gradient field coil, comprising:
   a pump for exhausting internal air from said sealed vessel;
   a control section for driving the gradient field coil and high-frequency coil in accordance with a pulse sequence selected from a plurality of types of pulse sequences in order to generate an MR signal from an object and acquire the MR signal; and
   a pump control section for changing an ON time of said pump in accordance with the selected pulse sequence.

10. A magnetic resonance imaging apparatus including a static field magnet, a gradient field coil, a high-frequency coil, and a sealed vessel housing the gradient field coil, comprising:
    a pump for exhausting internal air from said sealed vessel;
    a control section for driving the gradient field coil and high-frequency coil in accordance with a pulse sequence selected from a plurality of types of pulse sequences in order to generate an MR signal from an object and acquire the MR signal; and a pump control section for driving said pump when the selected pulse sequence is a first pulse sequence, and stopping said pump when the selected pulse sequence is a second pulse sequence.

11. An apparatus according to claim 10, further comprising a vacuum gage for detecting a degree of vacuum in the sealed vessel.

12. An apparatus according to claim 11, further comprising a processing section for correcting a phase and/or frequency of data from said high-frequency coil in accordance with the detected degree of vacuum.

13. An apparatus according to claim 10, further comprising a control section for stopping the gradient field coil, the high-frequency coil, and data acquisition when the detected degree of vacuum does not satisfy a predetermined condition.

14. A magnetic resonance imaging apparatus including a static field magnet, a gradient field coil, a high-frequency coil, and a sealed vessel housing the gradient field coil, comprising:
- a shim coil for correcting a strength distribution of the static field;
- a vacuum gage for detecting a degree of vacuum in the sealed vessel; and
- means for changing a current supplied to said shim coil, on the basis of the detected degree of vacuum.

15. A magnetic resonance imaging apparatus including a static field magnet, a gradient field coil, a high-frequency coil, a sealed vessel housing the gradient field coil, and a shim coil for correcting magnetic field inhomogeneity, comprising:
- a sensor for detecting a degree of vacuum in the sealed vessel; and
- a control section for changing a driving condition for the shim coil on the basis of the detected degree of vacuum.

16. A magnetic resonance imaging apparatus which generates an MR signal from an object by applying a gradient field pulse generated by a gradient field coil and a high-frequency magnetic field pulse generated by a high-frequency coil to the object in a static field, and reconstructs an image on the basis of the MR signal, comprising:
- a sealed vessel housing the gradient field coil;
- a pump for exhausting internal air from said sealed vessel;
- a control circuit for controlling operation of said pump;
- a pressure sensor for detecting an internal pressure in said sealed vessel; and
- a circuit for stopping driving said gradient field coil when the internal pressure in said sealed vessel which is detected by said pressure sensor is not less than a predetermined value.

* * * * *